US011515378B2

(12) United States Patent
Jung et al.

(10) Patent No.: US 11,515,378 B2
(45) Date of Patent: Nov. 29, 2022

(54) DISPLAY DEVICE HAVING A LIGHT SHIELDING LAYER DISPOSED ON A SECOND INSULATION LAYER COVERING AN UPPER SURFACE AND SIDEWALLS OF THE SECOND INSULATION LAYER

(71) Applicant: SAMSUNG DISPLAY CO., LTD., Yongin-si (KR)

(72) Inventors: Changyong Jung, Seoul (KR); Jaeneung Kim, Seoul (KR); Choongyoul Im, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 30 days.

(21) Appl. No.: 16/742,504

(22) Filed: Jan. 14, 2020

(65) Prior Publication Data

US 2020/0235186 A1     Jul. 23, 2020

(30) Foreign Application Priority Data

Jan. 23, 2019    (KR) .......................... 10-2019-0008688

(51) Int. Cl.
     *H01L 27/32*      (2006.01)
     *H01L 51/52*      (2006.01)

(52) U.S. Cl.
CPC ........ *H01L 27/3272* (2013.01); *H01L 27/322* (2013.01); *H01L 27/3246* (2013.01); *H01L 27/3276* (2013.01); *H01L 51/5237* (2013.01)

(58) Field of Classification Search
CPC ............... H01L 27/323; H01L 27/3246; H01L 27/3272; H01L 51/5237; H01L 51/5284
See application file for complete search history.

(56) References Cited

U.S. PATENT DOCUMENTS 8,933,902 B2    1/2015   Yeh et al.
9,342,166 B2*   5/2016   Cho ...................... G06F 3/0446
(Continued)

FOREIGN PATENT DOCUMENTS

KR    10-2014-0143646    12/2014
KR    10-2018-0046708    5/2018
KR    10-2018-0047559    5/2018

*Primary Examiner* — Anh D Mai
(74) *Attorney, Agent, or Firm* — F. Chau & Associates, LLC

(57) ABSTRACT

According to an exemplary embodiment of the present invention, a display device includes a base substrate provided with light emitting elements, an encapsulation layer covering the light emitting elements, a first conductive layer disposed on the encapsulation layer and comprising first conductive patterns, a first insulation layer disposed on the encapsulation layer to cover the first conductive patterns, a second conductive layer disposed on the first insulation layer and comprising first sensing patterns, second conductive patterns electrically connecting the first sensing patterns, and second sensing patterns electrically connected by the first conductive patterns, a second insulation layer disposed on the first insulation layer and the second conductive layer without overlapping the light emitting elements to cover the second conductive layer, and a light shielding layer covering the second insulation layer. The light shielding layer and the second insulation layer are in contact with the first insulation layer.

16 Claims, 17 Drawing Sheets

(56) References Cited

U.S. PATENT DOCUMENTS

| 9,552,092 | B2 | 1/2017 | Seo et al. |
| 2017/0271429 | A1* | 9/2017 | Kim .................. H01L 27/14601 |
| 2017/0278899 | A1* | 9/2017 | Yang .................... H01L 27/323 |
| 2018/0122868 | A1 | 5/2018 | Kim et al. |

* cited by examiner

DISPLAY DEVICE HAVING A LIGHT SHIELDING LAYER DISPOSED ON A SECOND INSULATION LAYER COVERING AN UPPER SURFACE AND SIDEWALLS OF THE SECOND INSULATION LAYER

CROSS-REFERENCE TO RELATED APPLICATIONS

This application claims priority under 35 U.S.C. § 119 to Korean Patent Application No. 10-2019-0008688, filed on Jan. 23, 2019, the disclosure of which is incorporated by reference herein in its entirety.

BACKGROUND

The present inventive concept relates to a display device, and more particularly, to a display device and a method of manufacturing the same.

Various display devices used in multimedia devices such as televisions, mobile phones, tablet computers, navigation units, and game consoles have been developed.

The display device includes a display panel for displaying an image and an input sensing unit for sensing an external input. The display panel includes a plurality of scan lines, a plurality of data lines, a plurality of pixels connected to the plurality of scan lines and the plurality of data lines. Also, the display device includes a display area for displaying an image and a non-display area disposed adjacent to the display area. Also, the input sensing unit includes a plurality of detecting sensors and a plurality of sensing signal lines connected to the detecting sensors.

SUMMARY

The present disclosure provides a display device including an input sensing unit having improved sensing reliability and a method for manufacturing the same.

According to an exemplary embodiment of the present invention, a display device includes a base substrate provided with light emitting elements and on which a display area comprising a plurality of pixel areas and a light shielding area disposed adjacent to the pixel areas and a non-display area disposed adjacent to the display area are defined, a display element layer disposed on the base substrate and comprising a pixel defining layer having a plurality of light emitting openings which overlaps the pixel areas and a plurality of light emitting elements, which overlap the light emitting openings, respectively, an encapsulation layer covering the light emitting elements, a first conductive layer disposed on the encapsulation layer and comprising first conductive patterns, a first insulation layer disposed on the encapsulation layer to cover the first conductive patterns, a second conductive layer disposed on the first insulation layer and comprising first sensing patterns, second conductive patterns electrically connecting the first sensing patterns, and second sensing patterns electrically connected by the first conductive patterns, a second insulation layer disposed on the first insulation layer and the second conductive layer without overlapping the light emitting elements to cover the second conductive layer, and a light shielding layer disposed on the same layer as the second insulation layer to cover the second insulation layer and overlapping the light shielding area.

According to an exemplary embodiment of the present invention, a display device includes a base substrate comprising a display area and a non-display area disposed adjacent to the display area, a display element layer which is disposed on the base substrate and on which a plurality of pixel areas overlapping the display area are defined, wherein the display element layer includes a plurality of display elements overlapping the pixel areas respectively, an encapsulation layer disposed on the display element layer, first conductive patterns disposed on the encapsulation layer, a first insulation layer covering the first conductive patterns, second conductive patterns disposed on the first insulation layer, a second insulation layer covering the second conductive patterns, and a light shielding layer covering the second insulation layer. Each of the second insulation layer and the light shielding layer is in contact with the first insulation layer. The light shielding layer includes openings each of which overlaps a corresponding one of the display elements. The second insulation layer covers the second conductive patterns without overlapping the openings.

According to an exemplary embodiment of the present invention, a method of manufacturing a display device includes providing a display panel including a base substrate, a display element layer with a display element disposed on the base substrate, and an encapsulation layer disposed on the display element layer, forming first conductive patterns on the encapsulation layer, forming a first insulation layer on the first conductive patterns, forming second conductive patterns on the first insulation layer, forming a second insulation layer to cover the second conductive patterns without overlapping the display element, and forming a light shielding layer to cover the second insulation layer without overlapping the display element. Each of the second insulation layer and the light shielding layer is in contact with the first insulation layer.

BRIEF DESCRIPTION OF THE FIGURES

These and other features of the present inventive concept will become more apparent by describing in detail exemplary embodiments thereof with reference to the accompanying drawings of which.

DETAILED DESCRIPTION

Figure 1:
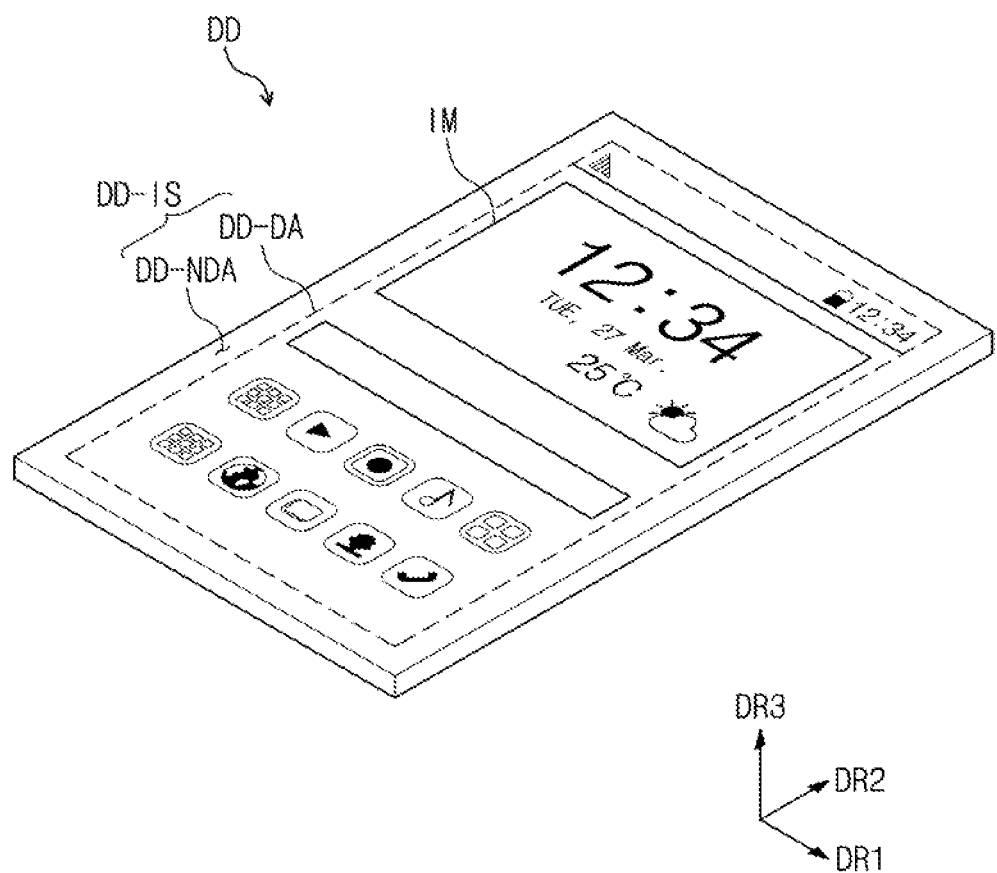
FIG. 1 is a perspective view illustrating a display device according to an embodiment of the inventive concept.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

Figure 2:
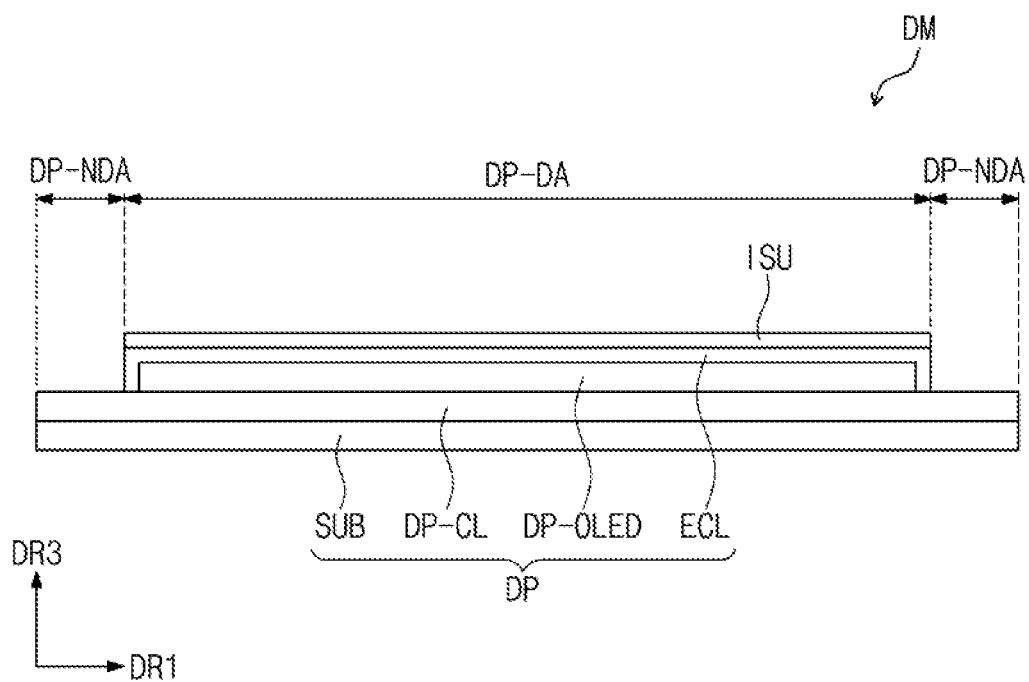
FIG. 2 is a cross-sectional view illustrating a display module according to an embodiment of the inventive concept.

FIG. 1 is a perspective view illustrating a display device according to an embodiment of the inventive concept. FIG. 2 is a cross-sectional view illustrating a display module according to an embodiment of the inventive concept.

Referring to FIG. 1, a display device DD may display an image IM through a display surface DD-IS. As an example of the image IM, a clock display window and application icons are illustrated. The display surface DD-IS includes a display area DD-DA for displaying the image IM and a non-display area DD-NDA disposed adjacent to the display area DD-DA. The non-display area DD-NDA is an area on which an image is not displayed.

For example, the non-display area DD-NDA may surround the display area DD-DA. However, the embodiment of the inventive concept is not limited thereto. For example, the non-display area DD-NDA may be disposed adjacent to only one portion of the display area or omitted according to embodiments.

The display surface DD-IS may have a shape extending in a first direction DR1 and a second direction DR2 crossing the first direction DR1. A normal direction of the display surface DD-IS, i.e., a thickness direction of the display device DD, may indicate a third direction DR3. In this specification, an expression of "when viewed from a plane," "on a plane," or an "area on a plane" may represent a case when viewed from the third direction DR3. Hereinafter, a front surface (or top surface) and a rear surface (or bottom surface) of each of layers or units may be distinguished from each other in the third direction DR3. However, directions indicated by the first to third directions DR1, DR2, and DR3 may be a relative concept and differently marked from as shown in FIGS. 1 and 2.

According to an embodiment of the inventive concept, although the display device DD has the display surface DD-IS having a rectangular shape, the embodiment of the inventive concept is not limited thereto. For example, the display device may include a display surface of which a portion has a curved shape on a plane or a three-dimensional display surface. The three-dimensional display surface may include a plurality display areas indicating directions different from each other. For example, the three-dimensional display surface may include a polygonal cylinder shaped display surface.

According to an embodiment of the inventive concept, the display device DD may be a flexible-type display device. However, the embodiment of the inventive concept is not limited thereto. For example, the display device DD according to an embodiment of the inventive concept may be a rigid-type display device. In the embodiment, the display device DD that is applicable to a mobile terminal is exemplarily illustrated. Although not shown, electronic modules, a camera module, and a power module, which are mounted on a mainboard, may be disposed on a bracket/case together with the display device DD to constitute the mobile phone terminal. The display device DD according to an embodiment of the inventive concept may be used for large-sized electronic devices such as televisions and monitors and small and medium-sized electronic devices such as tablet computers, navigation units for vehicles, game consoles, and smart watches.

Referring to FIG. 2, the display device DD may include a display module DM that displays an image and detects an external input. The display module DM may include a display panel DP and an input sensing unit ISU.

According to an embodiment of the inventive concept, the display panel DP may include an organic light emitting display panel, a liquid crystal display panel, or a quantum dot light emitting display panel. However, the embodiment of the inventive concept is not limited thereto. The organic light emitting display panel includes organic light emitting elements. The liquid crystal display panel includes liquid crystal molecules. The quantum dot light emitting display panel includes a quantum dot or a quantum rod.

Hereinafter, the display panel DP according to an embodiment of the inventive concept will be described as an organic light emitting display panel. However, the inventive concept is not limited thereto. For example, the present inventive concept may be applied to various display panels according to embodiments.

The display panel DP includes a base substrate SUB, a circuit element layer DP-CL, a display element layer DP- OLED, and an insulation layer ECL. The display panel DP includes a display area DP-DA and a non-display area DP-NDA. The display area DP-DA and the non-display area DP-NDA of the display panel DP may overlap the display area DP-DA and the non-display area DP-NDA of the display device DD, which are described in FIG. 1, respectively. The non-display area DP-NDA may be disposed at one side of the display area DP-DA or omitted.

The base substrate SUB may support all of components of the display panel DP and the input sensing unit ISU and include a flexible material. For example, the base substrate SUB may include a plastic substrate, a glass substrate, or an organic/inorganic composite substrate. Also, the base substrate SUB may be a laminated structure including a plurality of insulation layers. The plastic substrate may include at least one selected from the group consisting of an acrylic-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The circuit element layer DP-CL may include a plurality of insulation layers, a plurality of conductive layers, and a semiconductor layer. The plurality of conductive layers of the circuit element layer DP-CL may constitute signal lines or a control circuit of a pixel.

The display element layer DP-OLED is disposed on the base substrate SUB while overlapping the display area DP-DA. The display element layer DP-OLED may include a display element, e.g., organic light emitting diodes. However, the embodiment of the inventive concept is not limited thereto. In an example embodiment, the display element layer DP-OLED may include inorganic light emitting diodes or organic-inorganic hybrid light emitting diodes according to the kind of the display panel DP.

The insulation layer ECL may seal the display element layer DP-OLED. For example, the insulation layer ECL may overlap each of the display area DP-DA and the non-display area DP-NDA or overlap the display area DP-DA without overlapping the non-display area DP-NDA.

According to an embodiment, the insulation layer ECL may be provided as a thin-film encapsulation layer and include at least one insulation layer. The insulation layer ECL may also be referred to as an encapsulation layer. The insulation layer ECL according to an embodiment of the inventive concept may include at least one organic encapsulation layer and at least one inorganic encapsulation layer.

The inorganic encapsulation layer of the insulation layer ECL may protect the display element layer DP-OLED from moisture/oxygen, and the organic encapsulation layer of the insulation layer ECL may serve to protect the display element layer DP-OLED from foreign substances such as dust particles. Although the inorganic encapsulation layer may include a silicon nitride layer, a silicon oxynitride layer, a silicon oxide layer, a titanium oxide layer, or an aluminum oxide layer, the embodiment of the inventive concept is not limited thereto. In an example embodiment, the organic encapsulation layer may include an acrylic-based organic layer. However, the embodiment of the inventive concept is not limited thereto.

Although not shown, according to an embodiment, the insulation layer ECL may be an encapsulation substrate. The insulation layer ECL may serve to protect the display element layer DP-OLED from foreign substances such as moisture, oxygen, and dust particles. The insulation layer ECL may be coupled to the base substrate SUB through a sealant.

The input sensing unit ISU may detect an input applied from the outside. The input applied from the outside may be provided in various types. For example, the external input may include various types of external inputs generated by a portion of a user's body, a stylus pen, light, heat, or pressure. Also, in addition to an input generated by contact of a portion of a human body such as user's hands, a space touch (e.g., hovering), which is generated by being approached or adjacent, may be one type of the input.

According to an embodiment of the inventive concept, the input sensing unit ISU may be directly disposed on the display panel DP. In this specification, an expression of "component A is directly disposed on component B" represents that an intervening layer such as an adhesive layer is not present between component A and component B so that the component A and component B touch or are in contact with each other. The input sensing unit ISU may be manufactured with the display panel DP through a continuous process. That is, the input sensing unit ISU may be directly formed on the insulation layer ECL by the continuous process. In an example embodiment, the input sensing unit ISU may be in contact with the display panel DP.

Figure 3A:
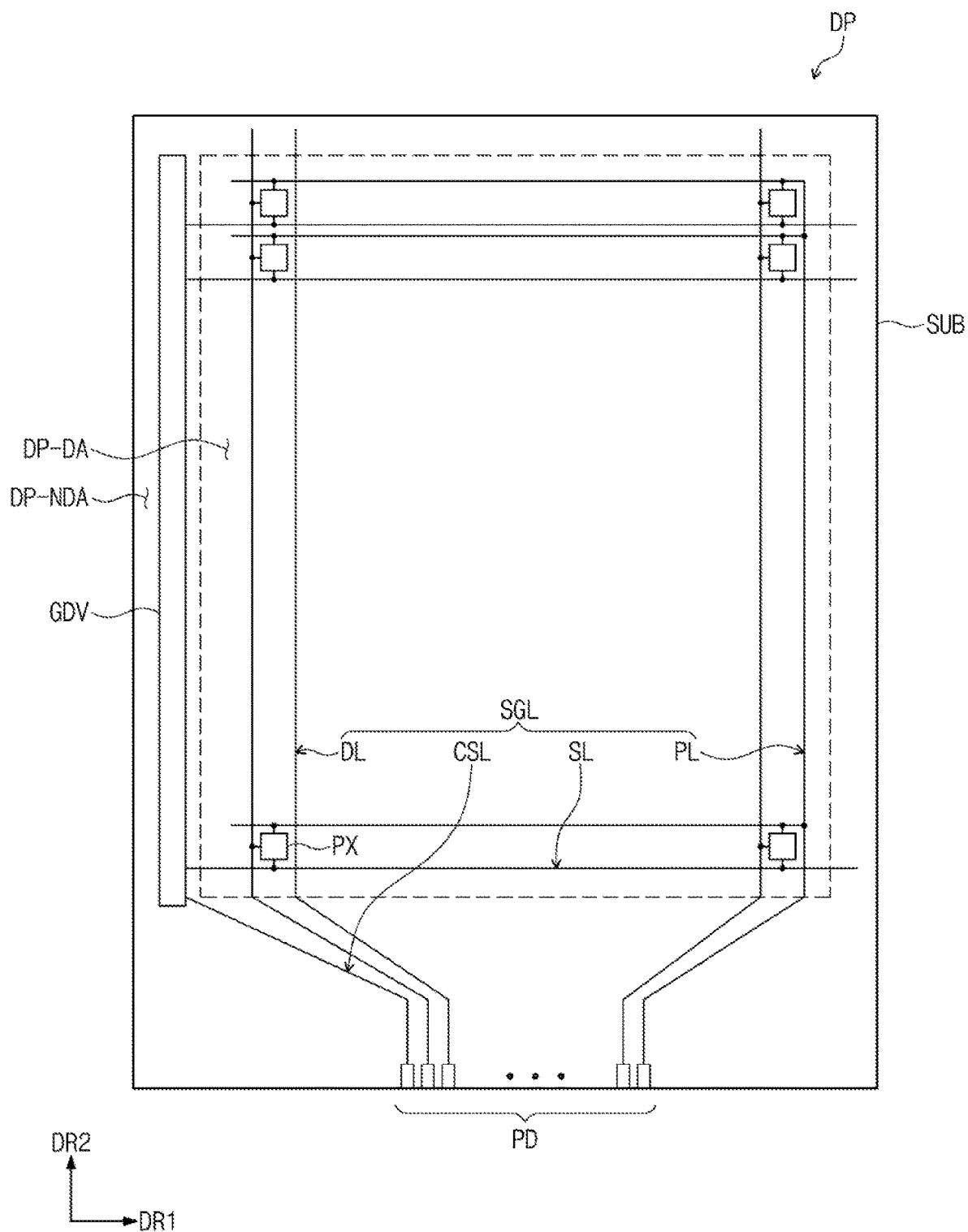
FIG. 3A is a plan view illustrating the display panel according to an embodiment of the inventive concept.
Figure 3B:
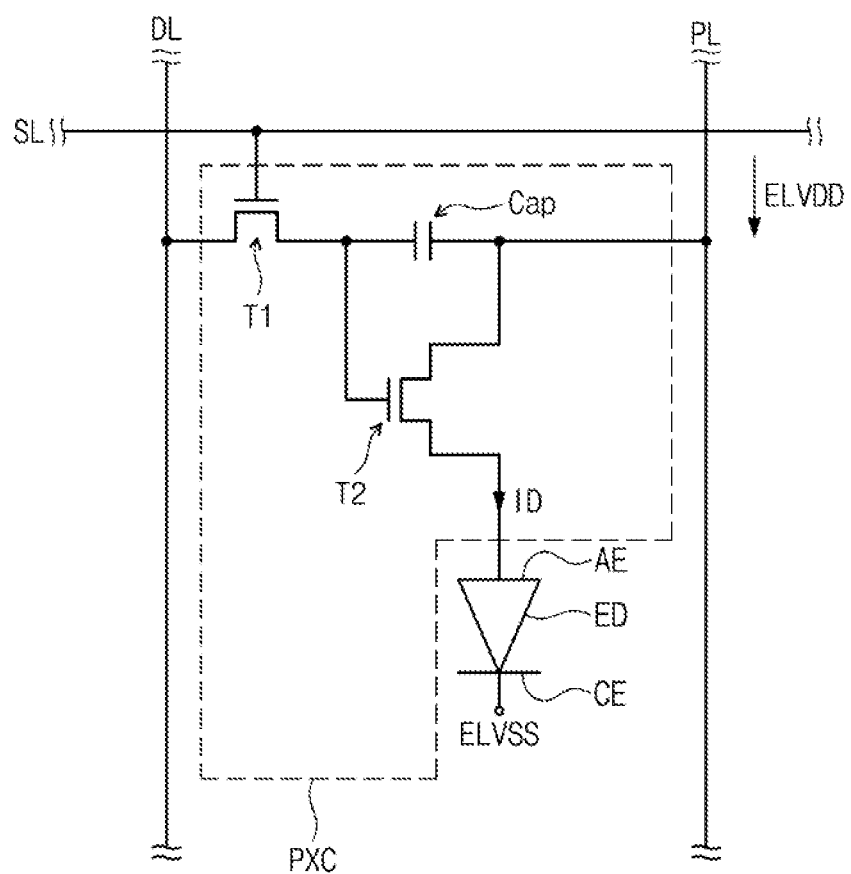
FIG. 3B is an equivalent circuit diagram of a pixel according to an embodiment of the inventive concept.
Figure 3C:
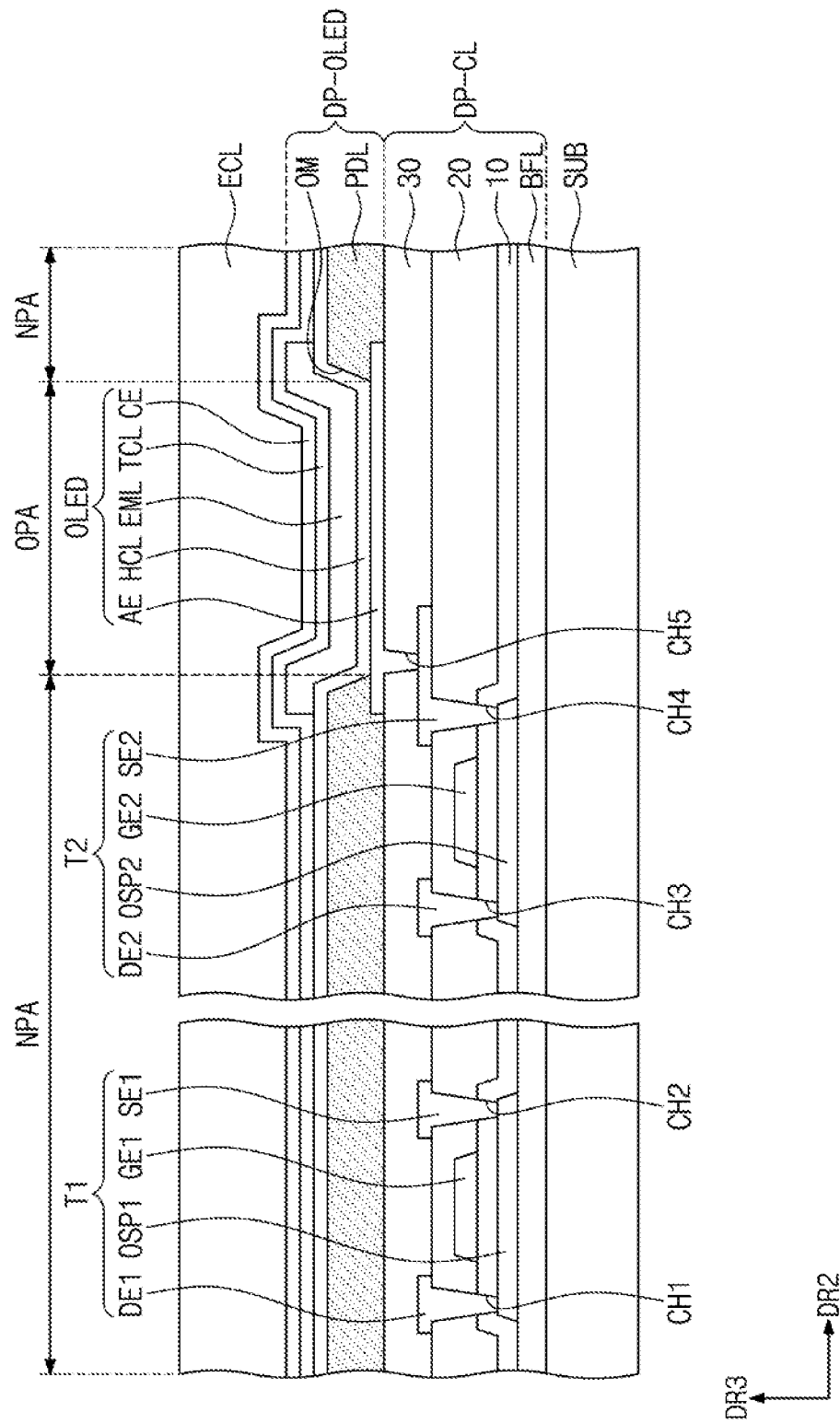
FIG. 3C is a cross-sectional view illustrating a portion of the display panel according to an embodiment of the inventive concept.

FIG. 3A is a plan view illustrating a display panel according to an embodiment of the inventive concept. FIG. 3B is an equivalent circuit diagram of a pixel according to an embodiment of the inventive concept. FIG. 3C is a cross-sectional view illustrating a portion of the display panel according to an embodiment of the inventive concept.

Referring to FIG. 3A, the display panel DP includes a scan driving circuit GDV, a plurality of signal lines SGL, a plurality of pixels PX, and a plurality of driving pads PD. An area on which the plurality of pixels PX are disposed is defined as the display area DP-DA.

The scan driving circuit GDV may generate a plurality of scan signals and sequentially output the plurality of scan signals to a plurality of scan lines. The scan driving circuit GDV may further output other control signals to the driving circuit of each of the pixels PX.

The plurality of signal lines SGL includes scan lines SL, data lines DL, a power line PL, and a control signal line CSL.

The scan lines SL are connected to corresponding pixels of the plurality of pixels PX, respectively, and the data lines DL are connected to corresponding pixels PX of the plurality of pixels PX, respectively. The power line PL is connected to the plurality of pixels PX. Also, the scan driving circuit GDV connected to the scan lines SL may be disposed on the non-display area DP-NDA. The control signal line CSL may provide control signals to the scan driving circuit GDV.

A portion of each of the scan lines SL, the data lines DL, the power line PL, and the control signal line CSL may be disposed on the same layer, and the other portion may be disposed on a different layer. When signal lines, which are disposed on a first layer, of the scan lines SL, the data lines DL, the power lines PL, and the control signal line CSL are defined as a first signal line, signal lines, which are disposed on a second layer, may be defined as a second signal line. Signal lines, which are disposed on a third layer, may be defined as a third signal line. The first, second and third layers may be different layers.

The display panel DP includes a plurality of driving pads PD that are electrically connected to the data lines DL, the power line PL, and the control signal line CSL. The driving pads PD overlap the non-display area DP-NDA.

Referring to FIG. 3B, a pixel PX connected to one scan line SL, one data line DL, and the power line PL is exemplarily illustrated. However, the embodiment of the inventive concept is not limited to the configuration of the pixel PX. For example, the pixel PX may have various configuration.

The pixel PX includes an organic light emitting element ED, a first electrode AE, a second electrode CE, and a pixel circuit PXC. The pixel PX includes an organic light emitting element ED as the display element.

The organic light emitting element ED, the first electrode AE, and the second electrode CE may be contained in the display element layer DP-OLED in FIG. 2. The organic light emitting element ED may be a front light emitting type diode or a rear light emitting type diode.

The pixel circuit PXC, which is a circuit part for driving the organic light emitting element ED, includes a first transistor T1 (or switching transistor), a second transistor T2 (or driving transistor), and a capacitor Cap. The pixel circuit PXC may be contained in the circuit element layer DP-CL in FIG. 2.

The organic light emitting element ED may generate light by an electric signal provided from the first and second transistors T1 and T2.

The first transistor T1 may output a data signal applied to the data line DL in response to a scan signal applied to the scan line SL. The capacitor Cap may charge a voltage corresponding to the data signal received from the first transistor T1. A first power voltage ELVDD is provided to the first electrode AE through the second transistor T2, and a second power voltage ELVSS is provided to the second electrode CE. The second power voltage ELVSS may be less than the first power voltage ELVDD.

The second transistor T2 is electrically connected to the organic light emitting element ED through the first electrode AE. The second transistor T2 may control a driving current ID flowing through the organic light emitting element ED in correspondence to an electric charge quantity stored in the capacitor Cap. The organic light emitting element ED may emit light during a turn-on period of the second transistor T2.

Referring to FIG. 3C, a partial cross-section of the display panel DP in correspondence to the equivalent circuit in FIG. 3B is illustrated. The circuit element layer DP-CL, the display element layer DP-OLED, and the insulation layer ECL are sequentially disposed on the base substrate SUB.

The circuit element layer DP-CL may include at least one insulation layer and at least one circuit element. The circuit element may include a signal line and a driving circuit of a pixel. The circuit element layer DP-CL may be formed through a process of forming an insulation layer, a semiconductor layer, and a conductive layer by coating, deposition, or the like and a process of patterning the insulation layer, the semiconductor layer, and the conductive layer by a photolithography process.

The circuit element layer DP-CL includes a buffer layer BFL, a first intermediate inorganic layer 10 and a second intermediate inorganic layer 20, which are inorganic layers, and an intermediate organic layer 30, which is an organic layer. The buffer layer BFL may include a laminated plurality of inorganic layers. FIG. 3C exemplarily illustrates an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2. The first semiconductor pattern OSP1, the first control electrode GE1, the first input electrode DE1, the first output electrode SE1 constitute the switching transistor T1. The second semiconductor pattern OSP2, the second control electrode GE2, the second input electrode DE2, and the second output electrode SE2 constitute the driving transistor T2. First to fourth through-holes CH1, CH2, CH3, and CH4 are also exemplarily illustrated.

The display element layer DP-OLED includes an organic light emitting diode OLED and a pixel defining layer PDL. The organic light emitting diode OLED corresponds to the organic light emitting element ED in FIG. 3B. The organic light emitting diode OLED includes a first electrode AE, a hole control layer HCL, a light emitting layer EML, an electron control layer TCL and a second electrode CE. According to an embodiment of the inventive concept, the pixel defining layer PDL may be provided as an organic layer and have, e.g., a black color.

The first electrode AE is disposed on the intermediate organic layer 30 (hereinafter, referred to as a 'planarization layer'). The first electrode AE is connected to the second output electrode SE2 through a fifth contact hole CH5 passing through the planarization layer.

According to an embodiment of the inventive concept, a light emitting opening OM is defined in the pixel defining layer PDL. The light emitting opening OM of the pixel defining layer PDL exposes at least a portion of the first electrode AE.

Although not separately shown, a spacer overlapping a portion of the pixel defining layer PDL may be disposed on a top surface of the pixel defining layer PDL. The spacer may be integrated with the pixel defining layer PDL, or an insulation structure provided by an additional process.

The display area DP-DA of the display panel DP may include a plurality of light emitting areas OPA and a non-light emitting area NPA disposed adjacent to the light emitting area OPA. The display element layer DP-OLED overlapping the display area DP-DA may include the light emitting areas OPA and the non-light emitting area NPA disposed adjacent thereto. For example, the non-light emitting area NPA may surround the light emitting areas OPA. In an embodiment, each of the light emitting areas OPA may be formed in a region corresponding to a partial area of the first electrode AE, which is exposed by the light emitting opening OM.

The hole control layer HCL may be disposed in both the light emitting areas OPA and the non-light emitting area NPA. The hole control layer HCL may include a hole transporting layer and a hole injection layer. The light emitting layer EML is disposed on the hole control layer HCL. The light emitting layer EML is disposed on an area corresponding to the light emitting opening OM. That is, the light emitting layer EML may be divided and provided on each of the pixels PX. The light emitting layer EML may contain an organic material and/or an inorganic material. The light emitting layer EML may generate colored light having a predetermined color.

The electron control layer TCL is disposed on the light emitting layer EML. The electron control layer TCL may include an electron transporting layer and an electron injection layer. The hole control layer HCL and the electron control layer TCL may be provided to the plurality of pixels by using an open mask. In an example embodiment, each of the hole control layer HCL and the electron control layer TCL may be continuously formed so that portions of the hole control layer HCL formed in the plurality of pixels may be connected to each other and portions of the electron control layer TCL formed in the plurality of pixels may be connected to each other. The second electrode CE is disposed on the electron control layer TCL. The second electrode CE is disposed on the electron control layer TCL having an integrated shape and contained in each of the plurality of pixels.

The insulation layer ECL is disposed on the second electrode CE. The insulation layer ECL may be provided as a single encapsulation layer or a plurality of thin films. Hereinafter, the insulation layer ECL will be described as an encapsulation layer.

Figure 4:
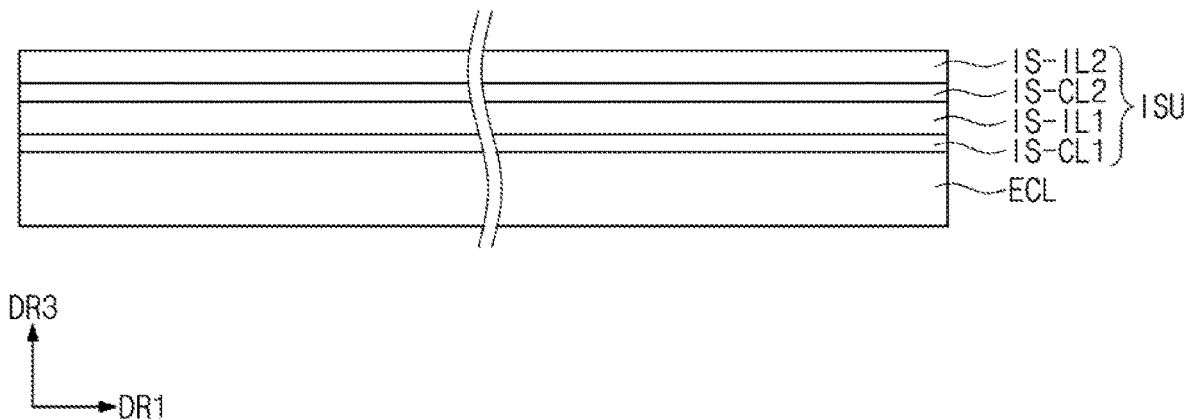
FIG. 4 is a cross-sectional view illustrating an input sensing unit according to an embodiment of the inventive concept.

FIG. 4 is a cross-sectional view illustrating the input sensing unit ISU according to an embodiment of the inventive concept.

Referring to FIG. 4, the input sensing unit ISU includes a first conductive layer IS-CL1, a first insulation layer IS-IL1, a second conductive layer IS-CL2, and a second insulation layer IS-IL2, which are disposed on the insulation layer ECL. The first conductive layer IS-CL1 is directly disposed on the insulation layer ECL.

Each of the first conductive layer IS-CL1 and the second conductive layer IS-CL2 may have a single-layer structure or a multilayer structure including a plurality of layers laminated in the third direction DR3. The multilayer structure may include at least two of the transparent conductive layers and the metal layers. The metal layers may include metals different from each other. The transparent conductive layer may include indium tin oxide (ITO), indium zinc oxide (IZO), zinc oxide (ZnO), or indium tin zinc oxide (ITZO), PEDOT:PSS (poly(3,4-ethylenedioxythiophene):polystyrene sulfonate), a metal nano-wire, and graphene. The metal layers may include molybdenum, silver, titanium, copper, aluminum, and an alloy thereof. In an example embodiment, each of the first and second conductive layers IS-CL1 and IS-CL2 may have a three-layer metal layer structure, e.g., a three-layer structure of titanium/aluminum/titanium.

Each of the first and second conductive layers IS-CL1 and IS-CL2 may include a plurality of conductive patterns. Hereinafter, it is assumed that the first conductive layer IS-CL1 includes first conductive patterns, and the second conducive layer IS-CL2 includes second conductive patterns. According to an embodiment of the inventive concept, the conductive patterns disposed on the same layer may be formed through the same process, include the same material, and have the same laminated structure.

Each of the first conductive patterns and the second conductive patterns may include sensing patterns and sensing signal lines connected thereto. The sensing patterns may have a mesh shape overlapping the non-light emitting area NPA and non-overlapping the light emitting areas OPA in FIG. 3C. Also, the sensing patterns may be transparent and overlap the light emitting areas OPA and the non-light emitting area NPA.

Each of the first insulation layers IS-IL1 and the second insulation layer IS-IL2 may include an inorganic material or an organic material. According to an embodiment of the inventive concept, each of the first insulation layer IS-IL1 and the second insulation layer IS-IL2 may be an organic layer containing an organic material. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

However, the embodiment of the inventive concept is not limited thereto. For example, each of the first insulation layer IS-IL1 and the second insulation layer IS-IL2 may be an inorganic layer containing an inorganic material. In this case, the inorganic layer may include at least one of aluminum oxide, titanium oxide, silicon oxide, silicon oxide nitride, zirconium oxide, and hafnium oxide.

According to an embodiment of the inventive concept, the input sensing unit ISU may detect an external input in a capacitive method. For example, the input sensing unit ISU may calculate coordinate information of an external input on the basis of capacitance variation between the second conductive patterns contained in the second conductive layer IS-CL2.

Here, a parasitic capacitance may be generated between the first conductive patterns and the second conductive patterns in the third direction DR3. Also, the parasitic capacitance may be generated between the second electrode CE of the second conductive layer IS-CL2 and the display element layer DP-OLED (refer to FIG. 3B).

The parasitic capacitance may affect a capacitance between the second conductive patterns, and thus overall reliability of the input sensing unit ISU may be degraded. For example, as a distance between the first conductive patterns and the second conductive patterns or a distance between the second conductive layer IS-CL2 and the display element layer DP-OLED decreases, a magnitude of the parasitic capacitance increases.

According to an embodiment of the inventive concept, the input sensing unit ISU may have an increased distance between the first conductive layer IS-CL1 and the second conductive layer IS-CL2 in the third direction DR3 in comparison with typical inventions. Accordingly, the parasitic capacitance between the first conductive layer IS-CL1 and the second conductive layer IS-CL2 or the parasitic capacitance between the second conductive layer IS-CL2 and the display element layer DP-OLED may decrease in magnitude.

In an example embodiment, in the third direction DR3, a thickness of the first insulation layer IS-IL1 may be greater than that of the second insulation layer IS-IL2. As the thickness of the first insulation layer IS-IL1 increases, a distance between the first conductive patterns and the second conductive patterns in the third direction DR3 increases to reduce the magnitude of the parasitic capacitance.

In an example embodiment, the thickness of the first insulation layer IS-IL1 increases, but an entire thickness of the display device DD may not be changed or may have a thickness increase less than the increase in the thickness of the first insulation layer IS-IL1. This will be described later in more detail with reference to FIG. 8.

Figure 5:
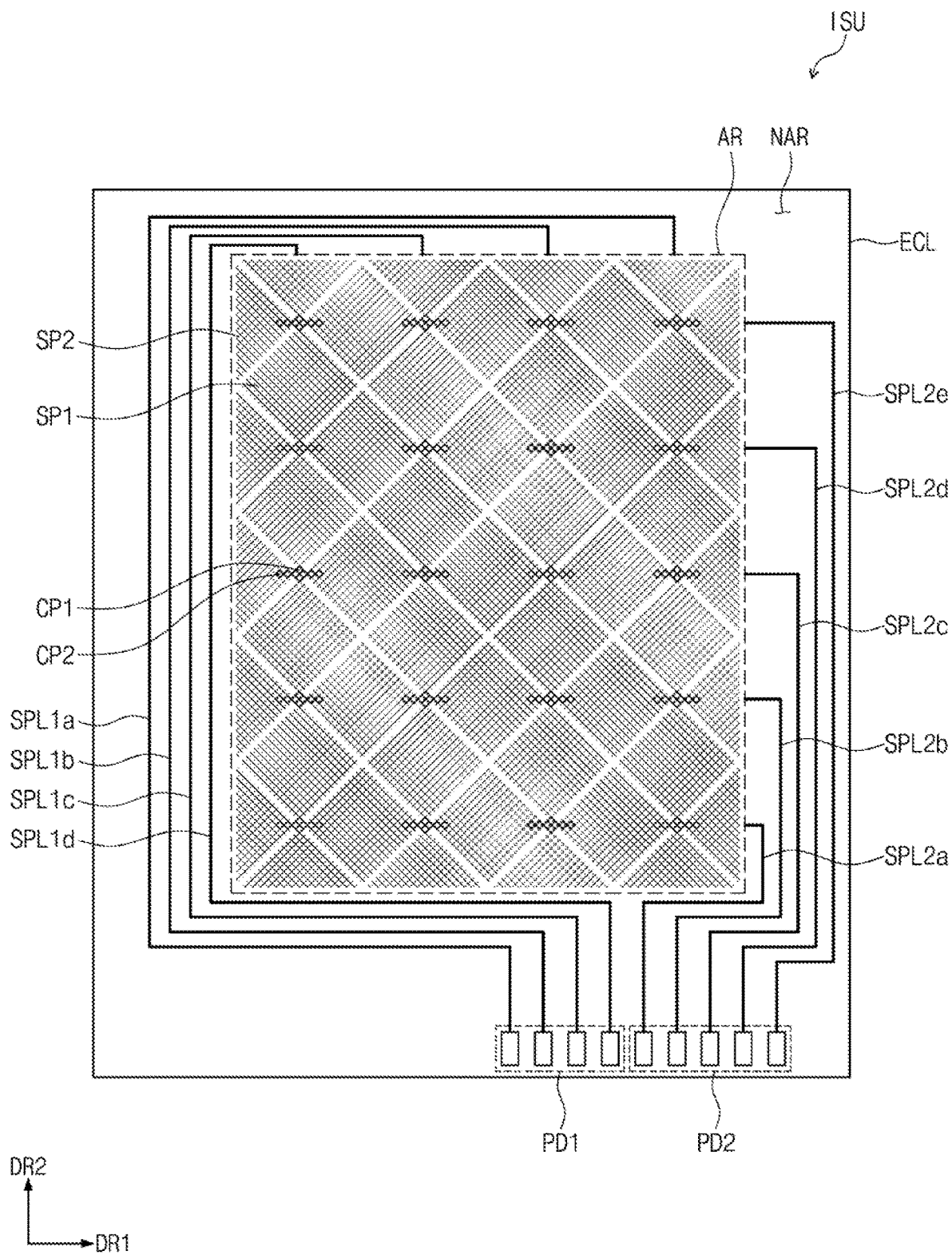
FIG. 5 is a plan view illustrating the input sensing unit according to an embodiment of the inventive concept.

FIG. 5 is a plan view illustrating the input sensing unit according to an embodiment of the inventive concept. FIGS. 6A to 6D are plan views illustrating the input sensing units according to embodiments of the inventive concept.

Referring to FIG. 5, the input sensing unit ISU includes a plurality of first sensor parts, a plurality of second sensor parts, a plurality of sensing signal lines, a first pad part PD1, and a second pad part PD2.

The input sensing unit ISU includes an active area AR and a non-active area NAR disposed adjacent to the active area AR. The active area AR may correspond to the display area DP-DA in FIG. 3A, and the non-active area NAR may correspond to the non-display area DP-NDA in FIG. 3A. Also, the input sensing unit ISU according to an embodiment of the inventive concept is described to be directly disposed on the insulation layer ECL.

The first sensor parts and the second sensor parts are disposed on the active area AR. The plurality of sensing signal lines, the first pad part PD1, and the second pad part PD2 are disposed on the non-active area NAR.

Each of the first sensor parts may have a shape that is arranged in the first direction DR1 and extends in the second direction DR2. Each of the first sensor parts may include a plurality of first sensing patterns SP1 and a plurality of first connecting patterns CP1 that connect the first sensing patterns SP1.

Each of the first sensing patterns SP1 and the first connecting patterns CP1 may have a mesh shape in which a plurality of mesh openings are defined. The first sensing patterns SP1 and the first connecting patterns CP1 are arranged in the second direction DR2. Each of the first connecting patterns CP1 connects two first sensing patterns, which are adjacent to each other, of the first sensing patterns SP1.

Each of the second sensor parts may have a shape that extends in the first direction DR1 and is arranged in the second direction DR2. Each of the second sensor parts may include a plurality of second sensing patterns SP2 and a plurality of second connecting patterns CP2 that connect the second sensing patterns SP2.

Each of the second sensing patterns SP2 and the second connecting patterns CP2 may have a mesh shape in which a plurality of mesh openings are defined. The second sensing patterns SP2 and the second connecting patterns CP2 are arranged in the first direction DR1. Each of the second connecting patterns CP2 connects two second sensing patterns, which are adjacent to each other, of the second sensing patterns SP2.

The first sensing patterns SP1 contained in the first sensor parts and the second sensing patterns SP2 contained in the second sensor parts may be capacitively coupled. As sensing signals are applied to the first sensing patterns SP1, capacitors are formed between the first sensing patterns SP1 and the second sensing patterns SP2.

According to an embodiment of the inventive concept, the second connecting patterns CP2 may be contained in the first conductive layer IS-CL1 and correspond to the first conductive patterns described in FIG. 5. The first sensing patterns SP1, the second sensing patterns SP2, and the second connecting patterns CP2 may be contained in the second conductive layer IS-CL2 and correspond to the second conductive patterns described in FIG. 5. However, the embodiment of the inventive concept is not limited thereto. For example, the first conductive layer IS-CL1 and the second conductive layer IS-CL2 may change in position from each other.

The plurality of sensing signal lines include first sensing signal lines SPL1a to SPL1d and second sensing signal lines SPL2a to SPL2e. Each of the first sensing signal lines SPL1a to SPL has one end connected to the first sensing patterns SP1 and the other end connected to a pad contained in the first pad part PD1. The first sensing signal lines SPL1a to SPL1d may transmit a sensing signal output from the first pad part PD1 to the first sensing patterns SP1.

The second sensing signal lines SPL2a to SPL2e have one ends connected to the second sensing patterns SP2, respectively. The second sensing signal lines SPL2a to SPL2e have the other ends connected to the pads contained in the second pad part PD2, respectively. The second sensing signal lines SPL2a to SPL2e may transmit an electric signal output from the second pad part PD2 to the second sensing patterns SP2.

Although not shown, each of the first sensing signal lines SPL1a to SPL1d and the second sensing signal lines SPL2a to SPL2e may have a mesh shape.

Hereinafter, an arrangement structure between the first conductive layer IS-CL1, the first insulation layer IS-IL1, and the second insulation layer IS-IL2 will be described in detail through FIGS. 6A to 6C.

Figure 6A:
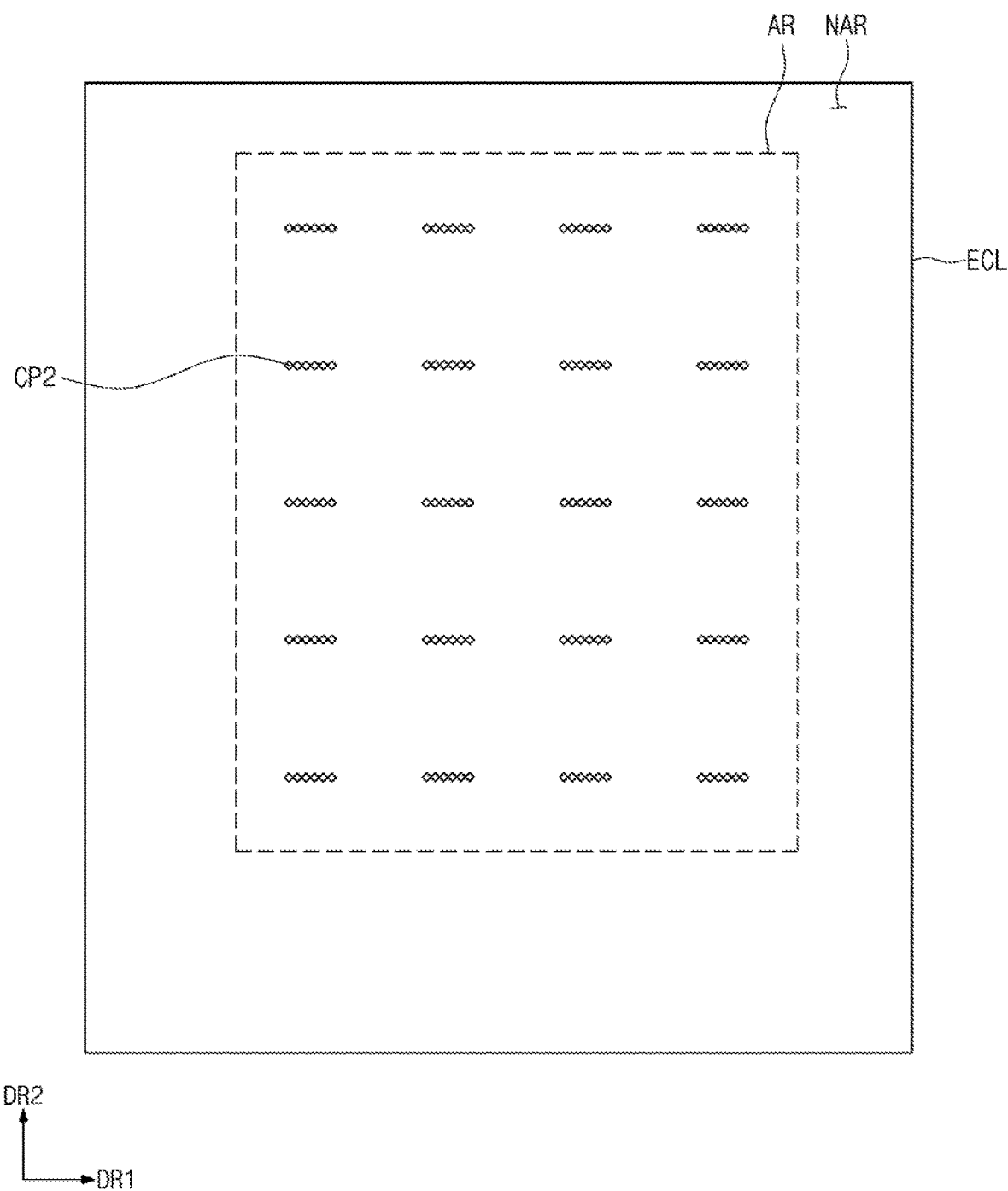
FIGS. 6A to 6D are plan views illustrating input sensing units according to embodiments of the inventive concept.

Referring to FIG. 6A, the second connecting patterns CP2 may overlap the active area AR and be directly disposed on the insulation layer ECL of the display panel DP. In this specification, the second connecting patterns CP2 may correspond to first conductive patterns contained in the first conductive layer IS-CL1.

Figure 6B:
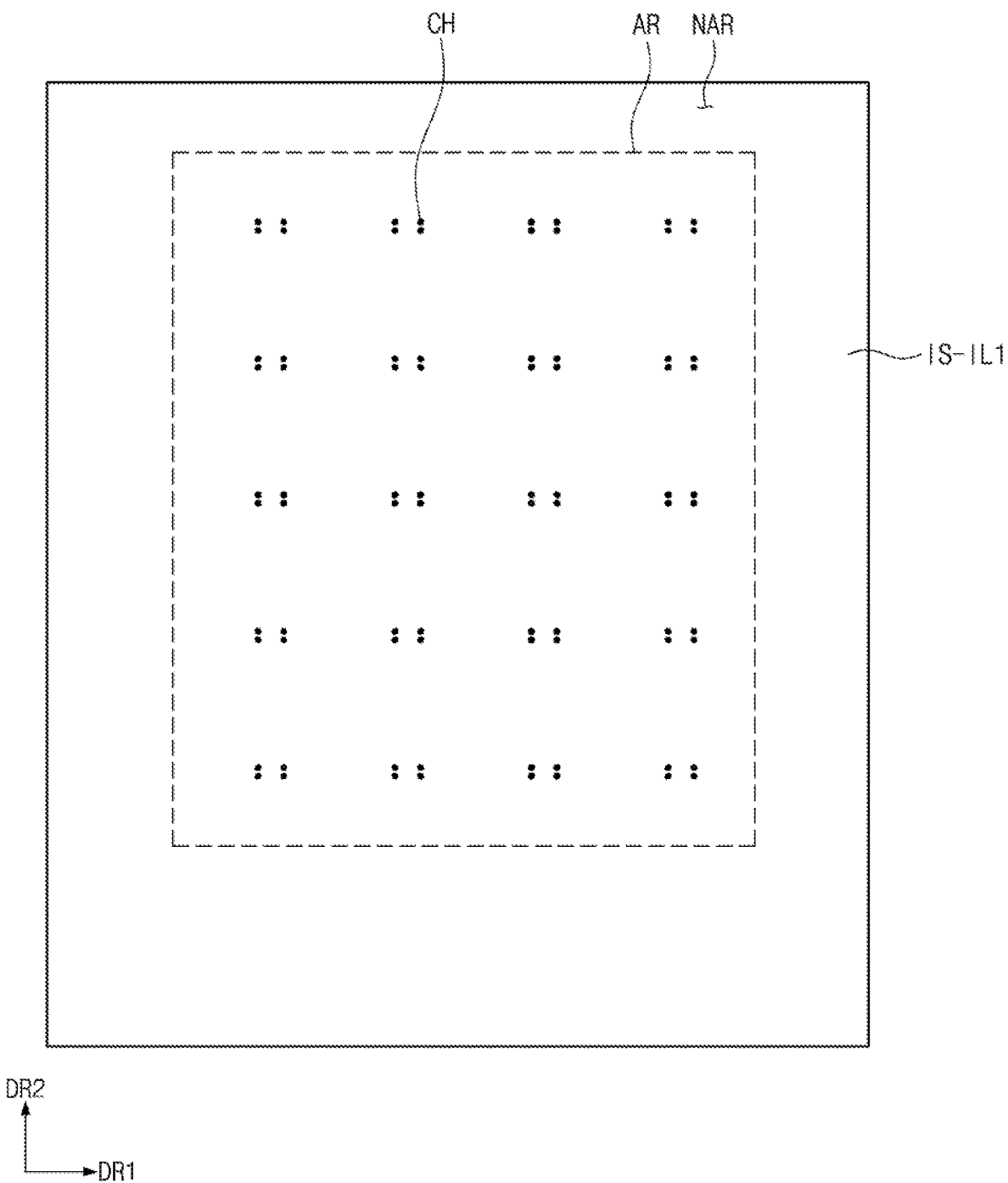

Referring to FIG. 6B, the first insulation layer IS-IL1 may be disposed on the insulation layer ECL while covering the second connecting patterns CP2. In an example embodiment, the first insulation layer IS-IL1 may be disposed on the insulation layer ECL while entirely covering the active area AR and the non-active area NAR.

Also, the first insulation layer IS-IL1 may include contact holes CH that partially expose the second connecting patterns CP2. In an example embodiment, the contact holes CH may be formed in the first insulation layer IS-IL1 through a photolithography process.

According to an embodiment of the inventive concept, the first insulation layer IS-IL1 may have a thickness greater than that of the second insulation layer IS-IL2. The first insulation layer IS-IL1 may be provided as an organic layer.

Figure 6C:
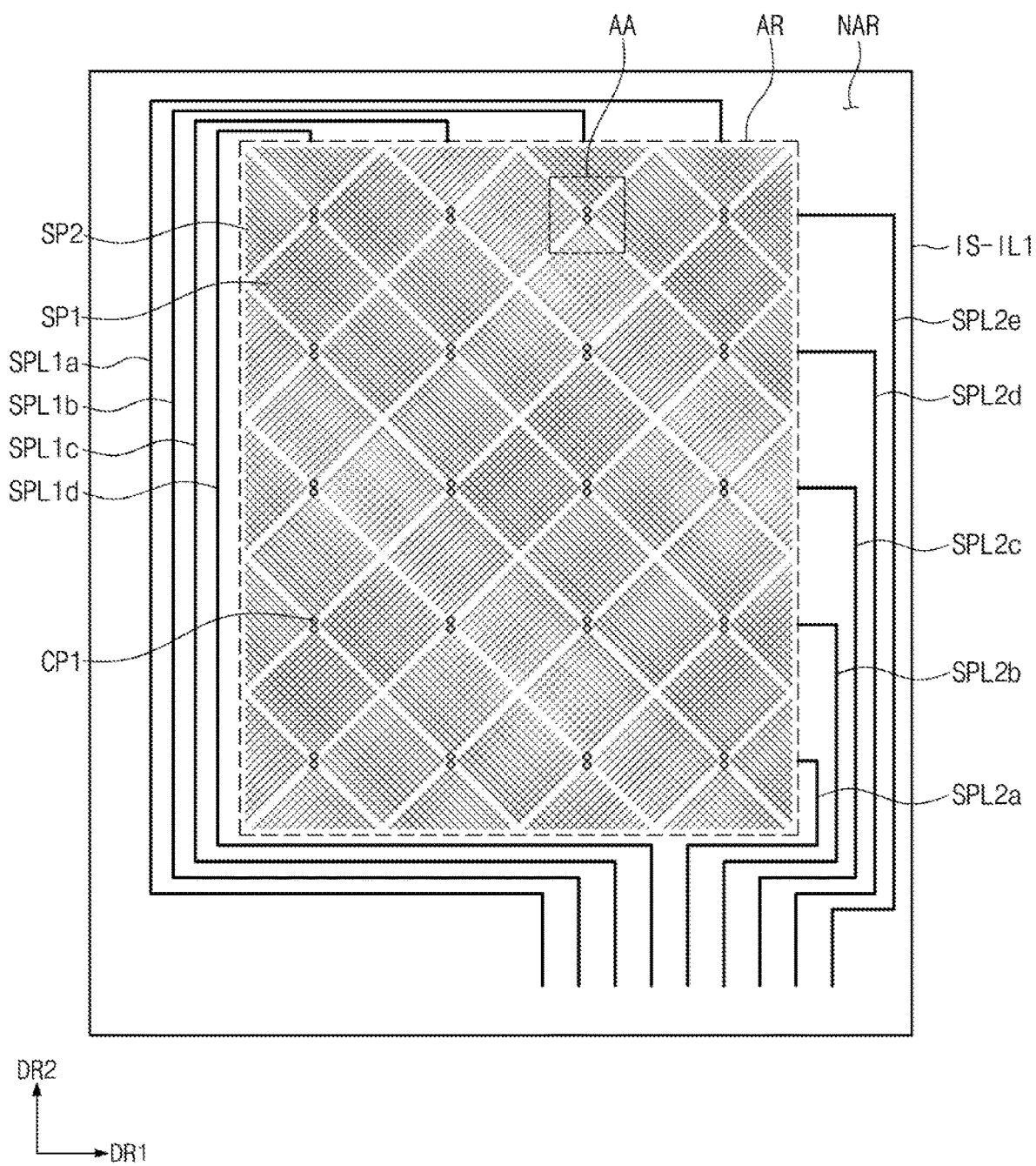

Referring to FIG. 6C, the first sensing patterns SP1, the second sensing patterns SP2, and the first connecting patterns CP1 may overlap the active area AR and be disposed on the first insulation layer IS-IL1.

The first sensing patterns SP1 may be insulated from the second sensing patterns SP2 by being spaced apart therefrom. The first sensing patterns SP1 may be connected to each other by the first connecting patterns CP1. In an example embodiment, the first sensing patterns SP1 and the first connecting patterns CP1 may be positioned at the same height with respect to the insulation layer ECL. The second sensing patterns SP2 may be connected to the second connecting patterns CP2 through the contact holes CH formed in the first insulation layer IS-IL1. In an example embodiment, the second connecting patterns CP2 may be positioned at a height lower than that of the second sensing patterns SP2 with respect to the insulation layer ECL.

Also, the sensing signal lines SPL1a to SPL1d and SPL2a to SPL2e may be disposed on the first insulation layer IS-IL1 while overlapping the non-active area NAR. The sensing signal lines SPL1a to SPL1d and SPL2a to SPL2e may be electrically connected to the first sensing patterns SP1 and the second sensing patterns SP2.

However, the embodiment of the inventive concept is not limited to the structure of the sensing signal lines. For example, the sensing signal lines may have various structures. For example, the sensing signal lines may further include third sensing signal lines connected to the first sensing patterns SP1. In this case, the first sensing signal lines SPL1a to SPL1d may be connected to one ends of the first sensor parts, respectively, and the third sensing signal lines may be connected to the other ends of the first sensor parts, respectively.

Figure 6D:
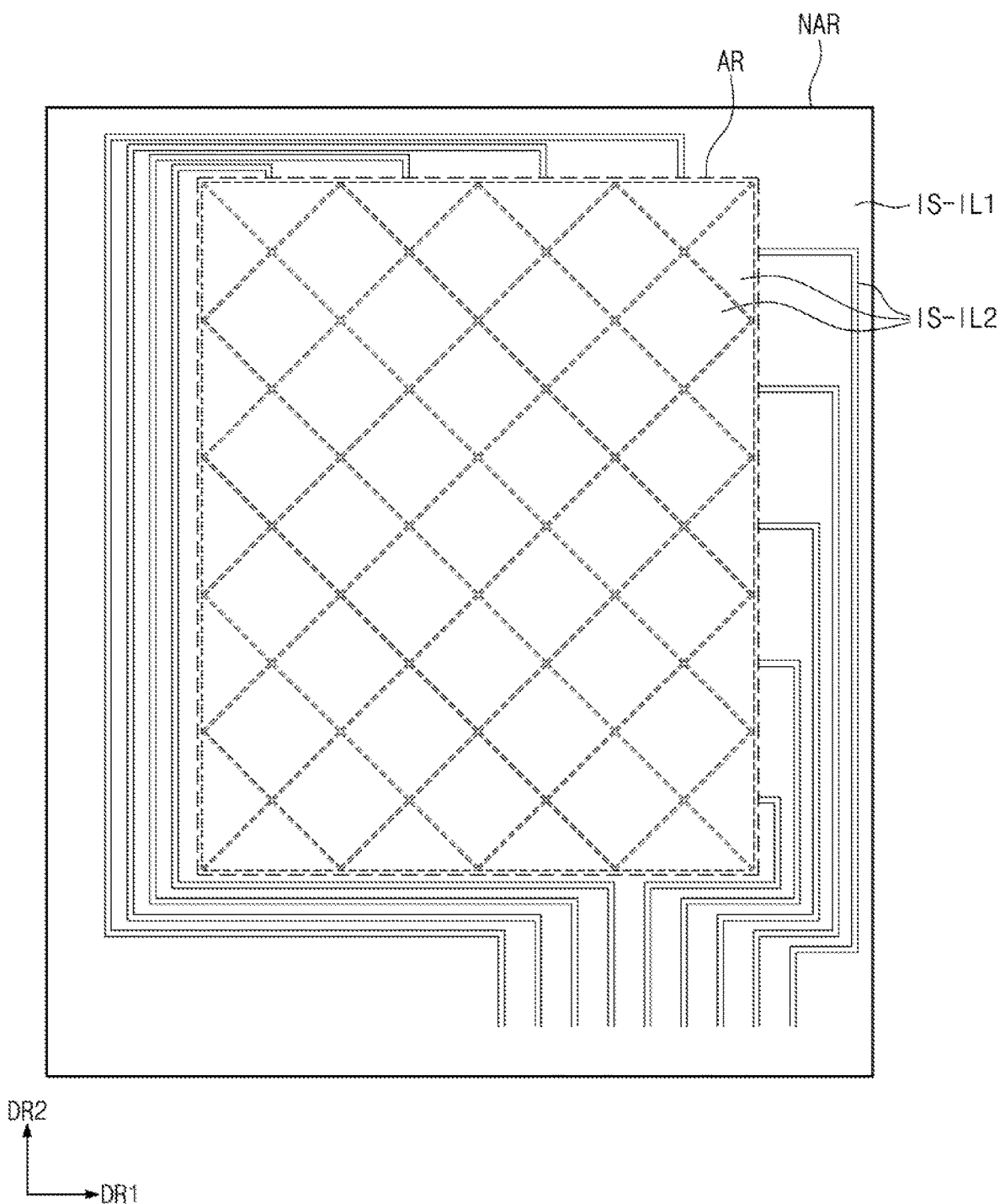

Referring to FIG. 6D, the second insulation layer IS-IL2 may be disposed on the first insulation layer IS-IL1 while covering the first sensing patterns SP1, the second sensing patterns SP2, the first connecting patterns CP1, and the sensing signal lines SPL1a to SPL1d and SPL2a to SPL2e.

According to an embodiment of the inventive concept, the second insulation layer IS-IL2 may partially overlap the active area AR and the non-active area NAR instead of entirely overlapping the active area AR and the non-active area NAR. For example, the second insulation layer IS-IL2 may entirely overlap the first sensing patterns SP1, the second sensing patterns SP2, and the first connecting patterns CP1 without overlapping at least one area of the mesh opening defined in each of the first sensing patterns SP1, the second sensing patterns SP2, and the first connecting patterns CP1. Also, the second insulation layer IS-IL2 may not overlap a portion between the first sensing patterns SP1 and a portion between the second sensing patterns SP2. The non-overlapping of the second insulation layer IS-IL2 with at least one area of the mesh opening, the portion between the first sensing patterns SP1 and the portion between the second sensing patterns SP2 may be described with reference to FIGS. 7A and 8, in addition to FIG. 6D.

Also, the second insulation layer IS-IL2 may entirely overlap the sensing signal lines SPL1a to SPL1d and SPL2a to SPL2e. In an example embodiment, the second insulation layer IS-IL2 may not overlap a portion of the first insulation layer IS-IL1 on which the sensing signal lines SPL1a to SPL1d and SPL2a to SPL2e are not disposed.

According to an embodiment of the inventive concept, as the second insulation layer IS-IL2 partially overlaps the active area AR and the non-active area NAR, the first insulation layer IS-IL1 may have an area greater than that of the second insulation layer IS-IL2 when viewed in a plan view.

Figure 7A:
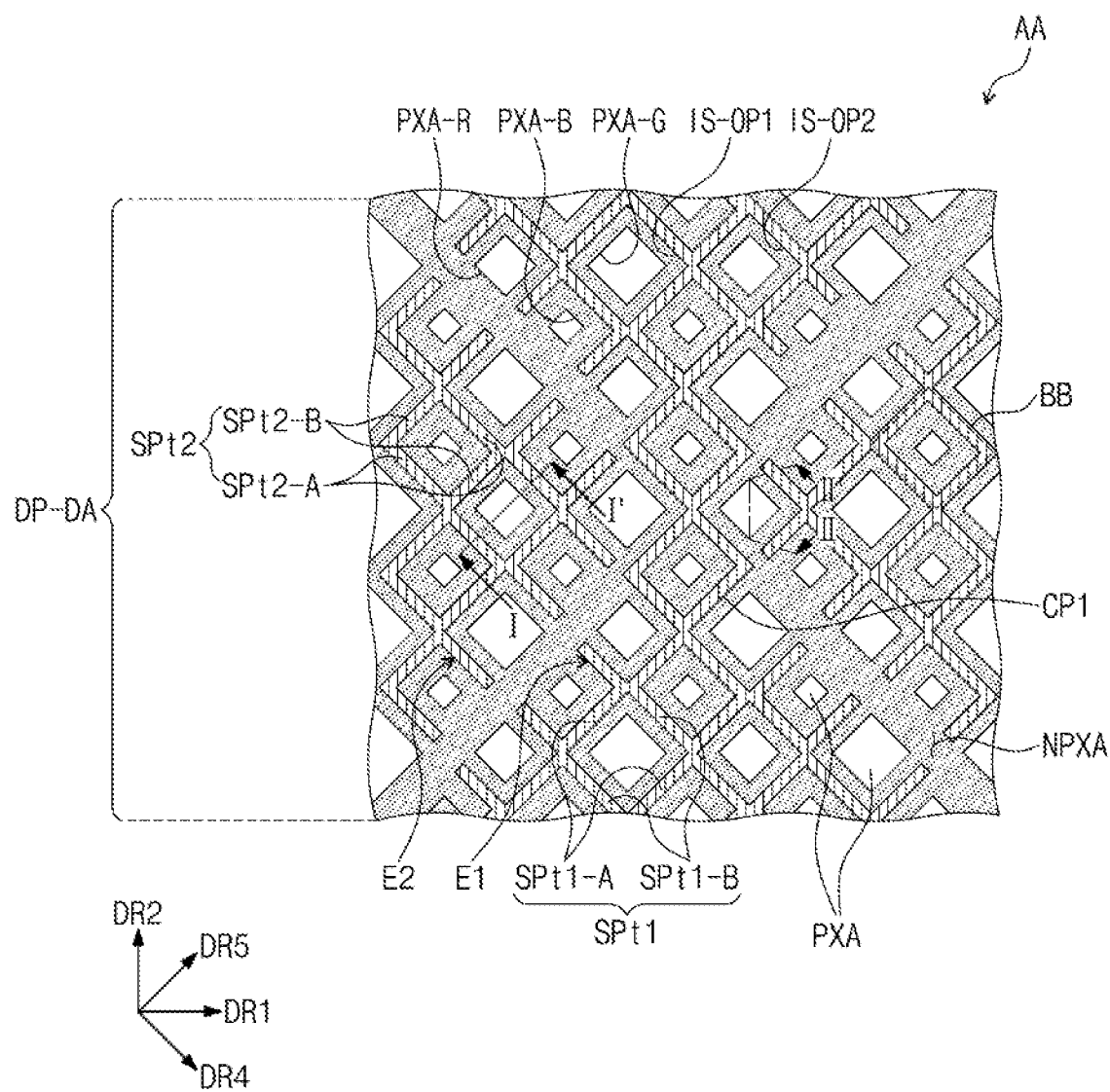
FIG. 7A is an enlarged view illustrating region AA in FIG. 6C.
Figure 7B:
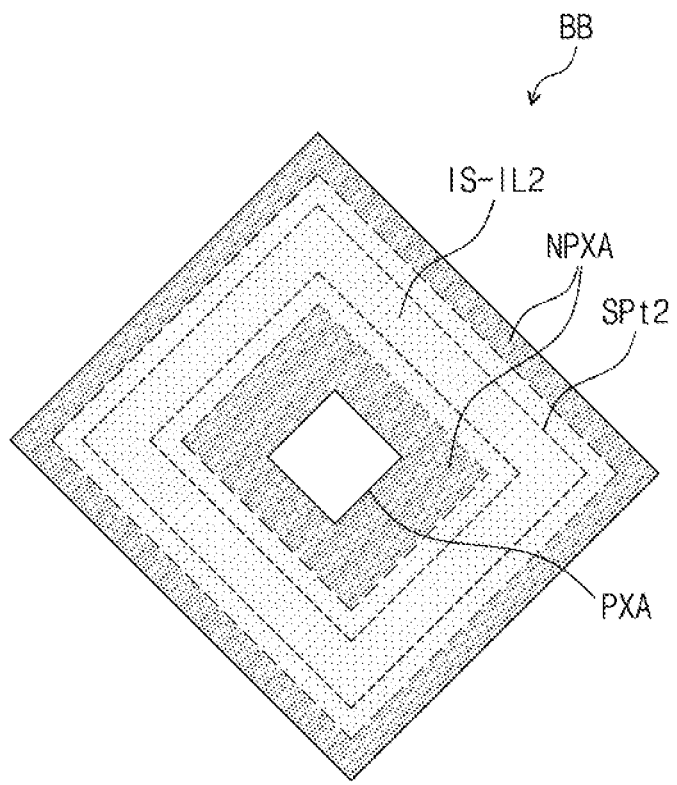
FIG. 7B is an enlarged view illustrating region BB in FIG. 7A.

FIG. 7A is an enlarged view illustrating region AA in FIG. 6C. FIG. 7B is an enlarged view illustrating region BB in FIG. 7A.

Referring to FIG. 7A, the display area DP-DA includes a plurality of pixel areas PXA-R, PXA-G, and PXA-B and a light shielding area NPXA disposed adjacent to the pixel areas PXA-R, PXA-G, and PXA-B. For example, the light shielding area NPXA may surround the pixel areas PXA-R, PXA-G, and PXA-B. Also, the pixel areas PXA-R, PXA-G, and PXA-B may overlap the plurality of light emitting areas OPA described in FIG. 3C, respectively. In this specification, the pixel areas represent areas through which light is substantially emitted to the outside through the display surface DD-IS described in FIG. 1.

The first sensing patterns SP1 include first mesh lines SPt1 that define the mesh openings. Although the first mesh lines SPt1 are descried to define the mesh openings, at least a portion of the first mesh lines SPt1 may not define the mesh openings. For example, a portion E1 of the first mesh lines SPt1, which is adjacent to an edge of the first sensing pattern SP1, may not define the mesh openings.

The second sensing patterns SP2 include second mesh lines SPt2 that define the mesh openings. Likewise, although the second mesh lines SPt2 are descried to define the mesh openings, at least a portion of the second mesh lines SPt2 may not define the mesh openings For example, a portion E2 of the second mesh lines SPt2, which is adjacent to an edge of the second sensing pattern SP2, may not define the mesh openings Also, each of the first mesh lines SPt1 and the second mesh lines SPt2 overlaps the light shielding area NPXA. Each of the first mesh lines SPt1 includes two first extension parts SPt1-A extending in a fifth direction DR5 crossing the first and second directions DR1 and DR2 and two second extension parts SPt1-B extending in a fourth direction DR4 crossing the fifth direction DR5. The first extension parts SPt1-A may be connected to the second extension parts SPt1-B while facing each other. The second extension parts SPt1-B may be connected to the first extension parts SPt1-A while facing each other. The mesh line may have a line width of several for example.

Each of the second mesh lines SPt2 includes two third extension parts SPt2-A extending in the fourth direction DR4 crossing the first and second directions DR1 and DR2 and two fourth extension parts SPt2-B extending in the fifth direction DR5 crossing the fourth direction DR4. The third extension parts SPt2-A may be connected to the fourth extension parts SPt2-B while facing each other. The fourth extension parts SPt2-B may be connected to the third extension parts SPt2-A while facing each other. The mesh line may have a line width of several for example.

According to an embodiment of the inventive concept, the mesh openings may have an area greater than that of each of the pixel areas PXA-R, PXA-G, and PXA-B. The second insulation layer IS-IL2 overlapping the active area AR in FIG. 6D may not overlap the pixel areas PXA-R, PXA-G, and PXA-B while covering the first mesh lines SPt1 and the second mesh lines SPt2.

As illustrated in FIG. 7B, the second insulation layer IS-IL2 may be disposed on the first insulation layer IS-IL1 while covering the second mesh lines SPt2 of the second sensing patterns SP2. In particular, the second insulation layer IS-IL2 may have a structure that non-overlaps the pixel area PXA. The second insulation layer IS-IL2 may not overlap one area of one mesh opening, which overlaps the pixel area PXA, and may overlap the rest area overlapping the light shielding area NPXA. That is, the second insulation layer IS-IL2 according to an embodiment of the inventive concept may have an opening pattern overlapping the pixel area PXA when viewed in a plan view. In FIG. 7B, the area defined by an outermost dashed line and an innermost dashed line may correspond to the second insulation layer IS-IL2; the area defined by two dashed lines adjacent to the outermost dashed line may correspond to the second mesh lines SPt2 of the second sensing patterns SP2.

Also, although not shown in FIG. 7B, the light shielding area NPXA may entirely overlap the second insulation layer IS-IL2. That is, a light shielding layer BY (refer to FIG. 8) that entirely covers the second insulation layer IS-IL2 may be disposed on the first insulation layer IS-IL1.

According to an embodiment of the inventive concept, each of the mesh openings corresponds to one of the pixel areas PXA-R, PXA-G, and PXA-B. The embodiment of the inventive concept, however, is not limited thereto. One mesh opening may overlap two or more light emitting areas. The mesh openings may include first mesh openings IS-OP1 having a first area and second openings IS-OP2 having a second area that is different from the first area.

In an example embodiment, each of the light emitting areas PXA-R, PXA-G, and PXA-B may have various sizes. For example, the light emitting areas PXA-R emitting first light, the light emitting areas PXA-G emitting second light, and the light emitting areas PXA-B emitting third light may have different sizes from each other. Here, the first to third light may emit light having the same color or light having different colors from each other.

However, the embodiment of the inventive concept is not limited thereto. For example, the light emitting areas PXA-R, PXA-G, and PXA-B may have the same size, and the mesh openings also may have the same size.

Figure 8:
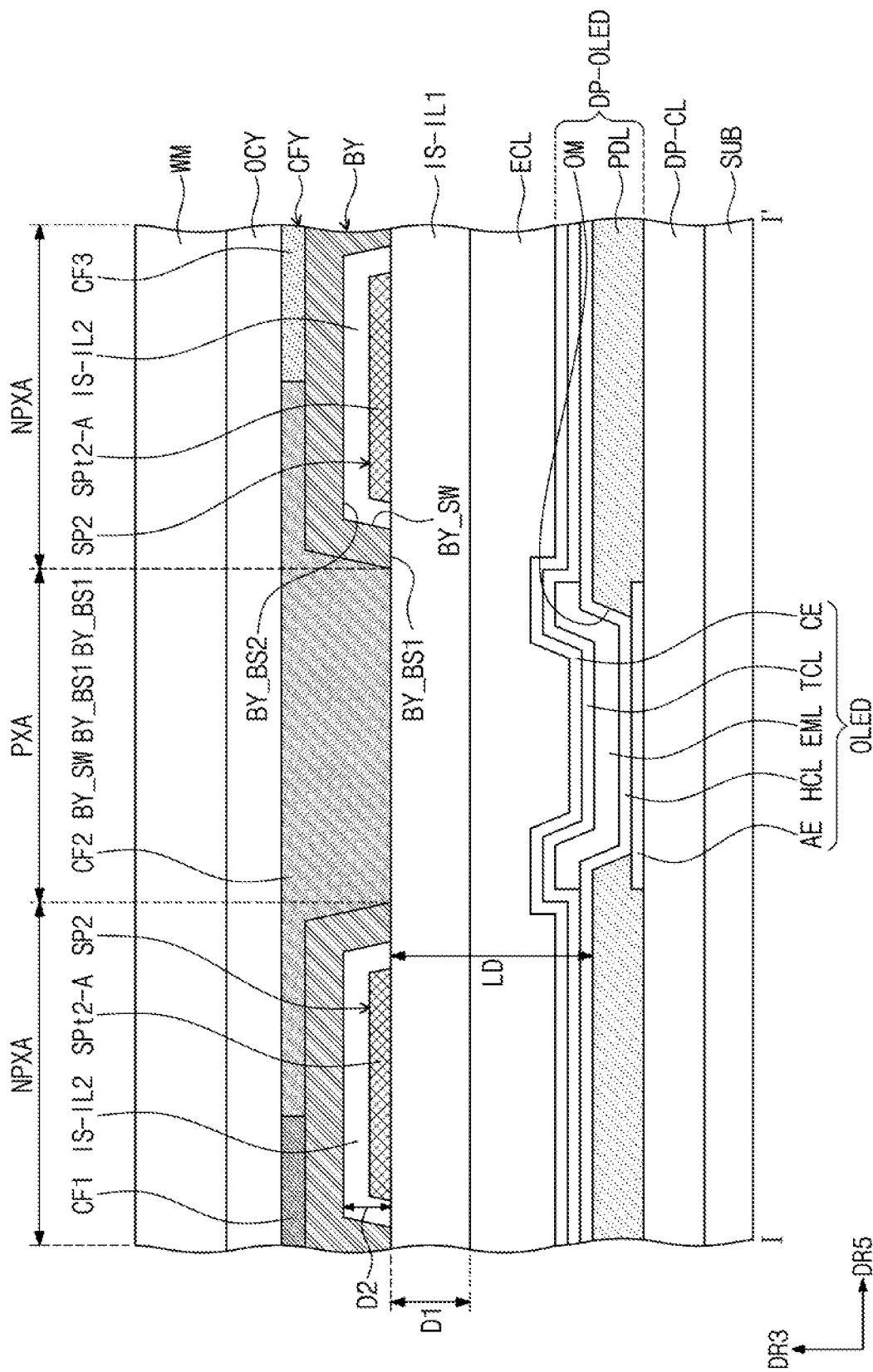
FIG. 8 is a cross-sectional view taken along line I-I' in FIG. 7A according to an embodiment of the inventive concept.
Figure 9A:
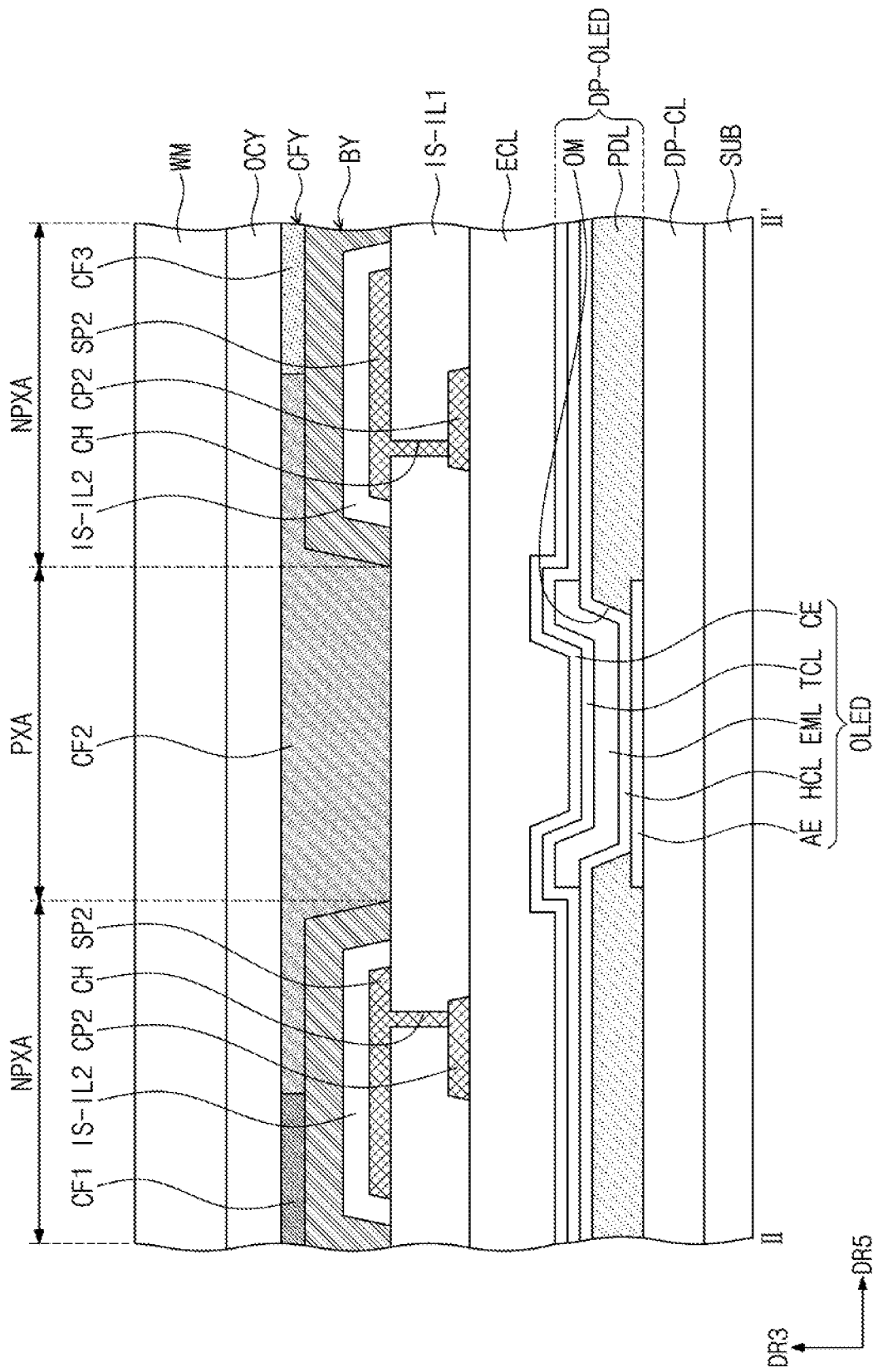
FIG. 9A is a cross-sectional view taken along line II-II' in FIG. 7A according to an embodiment of the inventive concept.
Figure 9B:
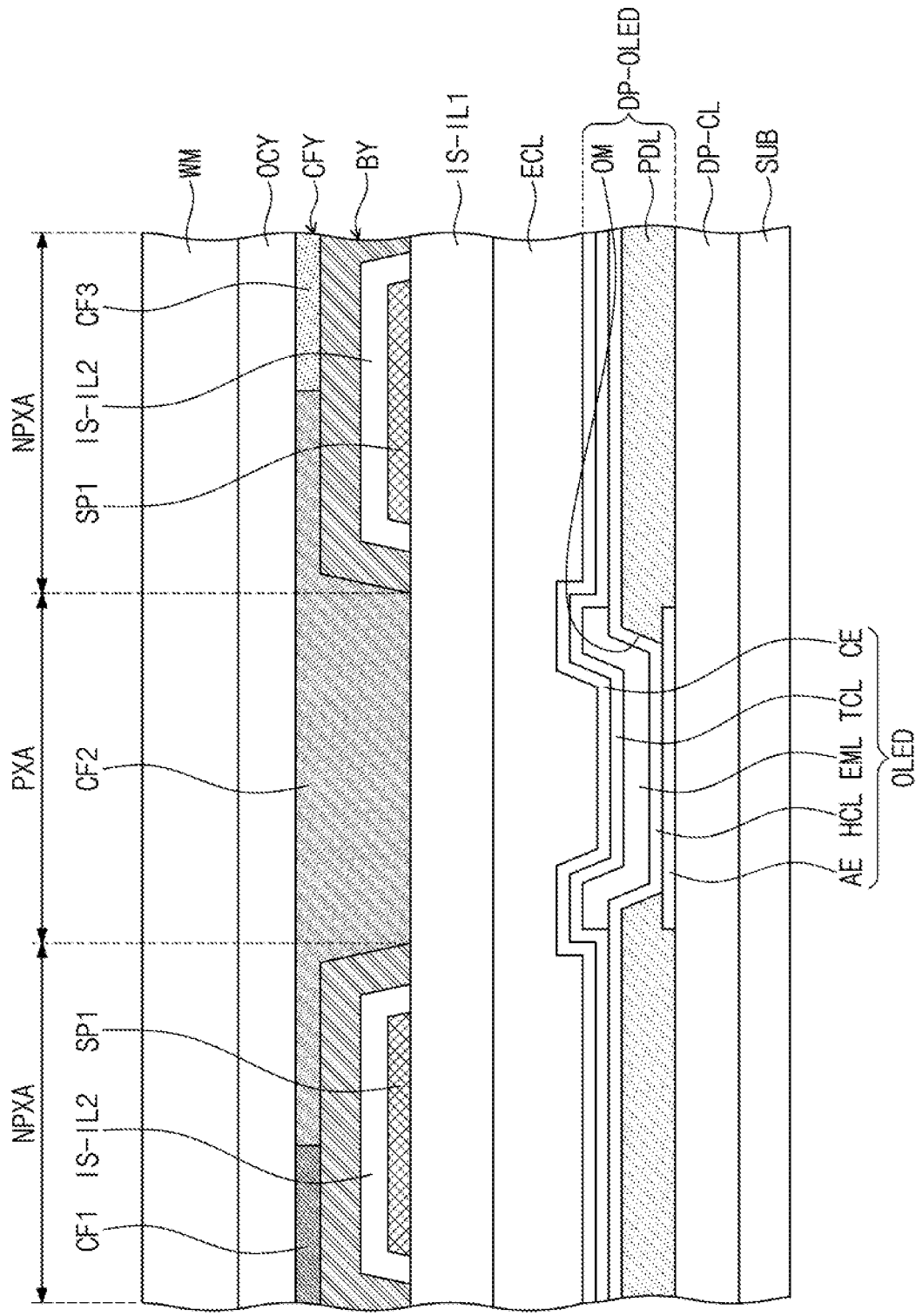
FIG. 9B is a partial cross-sectional view illustrating the display panel according to an embodiment of the inventive concept.
Figure 10:
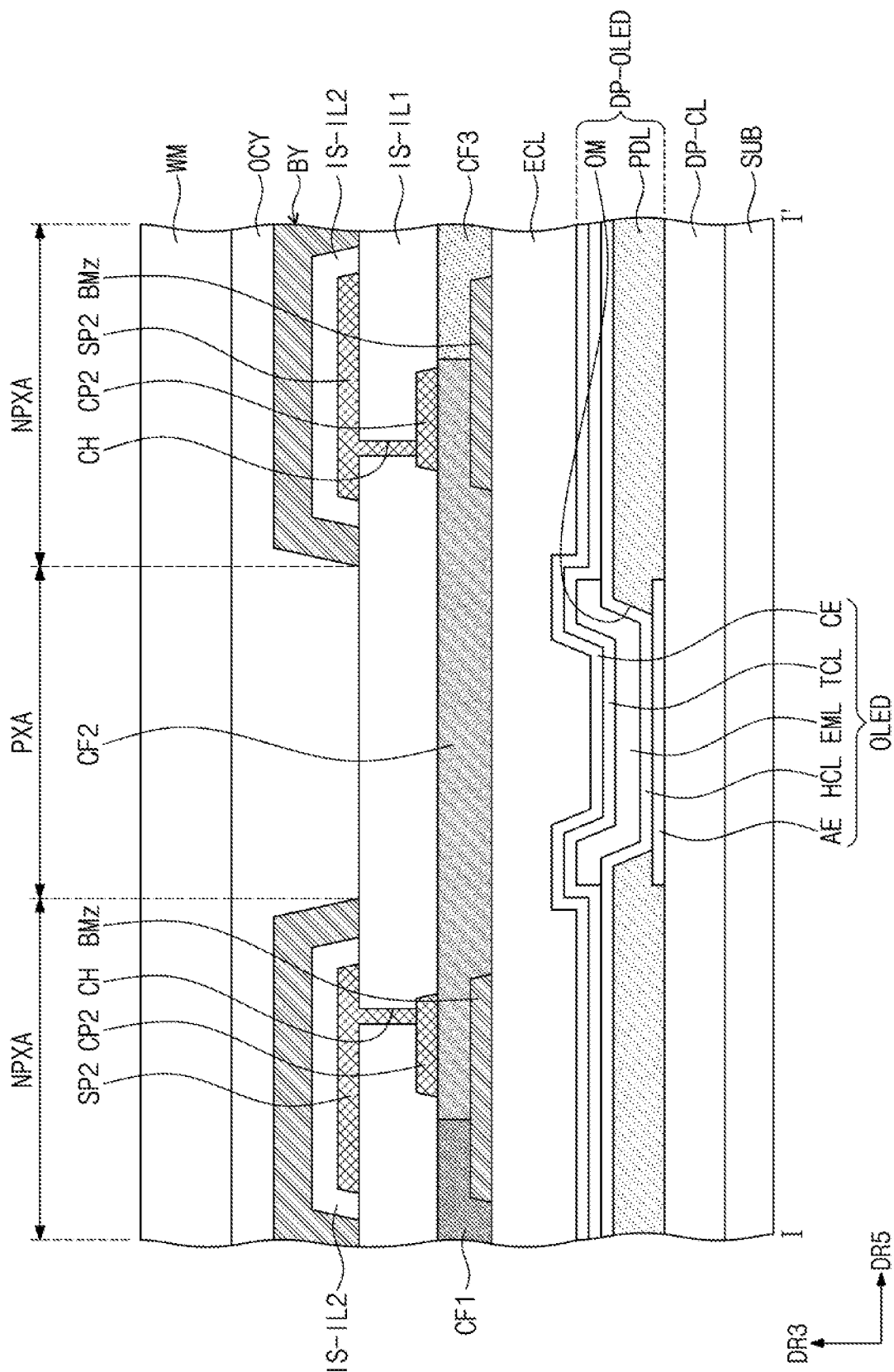
FIG. 10 is a cross-sectional view illustrating a display device according to another embodiment of the inventive concept.

FIG. 8 is a cross-sectional view taken along line I-I' of FIG. 7A according to an embodiment of the inventive concept. FIG. 9A is a cross-sectional view taken along line II-II' of FIG. 7A according to an embodiment of the inventive concept. FIG. 9B is a partial cross-sectional view illustrating the display panel according to an embodiment of the inventive concept. FIG. 10 is a cross-sectional view illustrating a display device according to another embodiment of the inventive concept.

Referring to FIG. 8, the display device DD may further include a window WM, a color filter layer CFY, a planarization layer OCY, and the light shielding layer BY in addition to the display module, which is previously described.

According to an embodiment of the inventive concept, the first insulation layer IS-IL1 is directly disposed on the insulation layer ECL of the display panel DP. Also, the first insulation layer IS-IL1 may have a first thickness D1 that is greater than a second thickness D2 of the second insulation layer IS-IL2. For example, the first insulation layer IS-IL1 may have a thickness of about 2.3 µm.

As described above, the first thickness D1 of the first insulation layer IS-IL1 and the second thickness D2 of the second insulation layer IS-IL2 may be different from each other. In particular, although the first thickness D1 of the first insulation layer IS-IL1 is greater than the second thickness D2 of the second insulation layer IS-IL2, a distance LD between the pixel defining layer PDL and the light shielding layer BY may not increase in comparison with a previous distance.

As a result, a distance between the first conductive patterns disposed on the insulation layer ECL and the second conductive patterns disposed on the first insulation layer IS-IL1 may increase. As the distance between the first conductive patterns and the second conductive patterns increases, the magnitude of the parasitic capacitance between the first conductive patterns and the second conductive patterns may be reduced.

Also, as the distance between the pixel defining layer PDL and the light shielding layer BY increases, brightness characteristics and viewing angle characteristics of light emitted through the pixel area PXA may be degraded. However, according to an embodiment of the inventive concept, the distance LD between the pixel defining layer PDL and the light shielding layer BY may be maintained so that the viewing angle and brightness characteristics are not degraded, and the distance between the first conductive patterns and the second conductive patterns may increase to reduce the magnitude of the parasitic capacitance therebetween.

Specifically, the second sensing patterns SP2 may be disposed on the first insulation layer IS-IL1. The second sensing patterns SP2 may correspond to the second conductive patterns.

The second insulation layer IS-IL2 may be disposed on the first insulation layer IS-IL1 while covering the second sensing patterns SP2. According to an embodiment of the inventive concept, the second insulation layer IS-IL2 may be disposed on the same layer as the first sensing patterns SP1, the second sensing patterns SP2, and the first connecting patterns CP1. In this specification, an expression of 'component A and component B are disposed on the same layer' represents that all of component A and component B are directly disposed on a component C corresponding to the same layer, or in contact with the component C. In other words, the expression may represent that both the component A and the component B touch the component C.

The light shielding layer BY and the second insulation layer IS-IL2 may be disposed on the same layer. In other words, the light shielding layer BY and the second insulation layer IS-IL2 may be in contact with the first insulation layer IS-IL1 corresponding to the same layer. The light shielding layer BY may entirely cover the second insulation layer IS-IL2. The light shielding layer BY may be disposed over the entire first insulation layer IS-IL1 overlapping the non-active area NAR as shown in FIG. 6D and disposed over the entire first insulation layers IS-IL1 overlapping the light shielding area NPXA of the active area AR.

According to an embodiment of the inventive concept, the light shielding layer BY may have a thickness that is different for each portion thereof instead of being entirely same. For example, the light shielding layer BY may have a first portion non-overlapping the second insulation layer IS-IL2 and a second portion overlapping the second insulation layer IS-IL2 and the second sensing patterns SP2. The first portion may have a thickness greater than that of the second portion. The light shielding layer BY may have a bottom surface recessed in the third direction DR3 to accommodate the second sensing patterns SP2 and the second insulation layer IS-IL2, thereby offsetting the increase in the thickness of the first insulation layer IS-IL1. In an example embodiment, the bottom surface of the light shielding layer BY may include a first bottom surface BY_BS1 and a second bottom surface BY_BS2. The first bottom surface BY_BS1 may be in contact with the first insulating layer IS-IL1, and the second bottom surface BY_BS2 may be recessed in the third direction DR3 to be spaced apart from the first insulation layer IS-IL1.

Here, although the thickness of the first insulation layer IS-IL1 increases, as the second insulation layer IS-IL2 according to an embodiment of the inventive concept is disposed on the same layer as the light shielding layer BY and disposed in an inner space of the light shielding layer BY, the thickness of the display device DD may not substantially increase. In an example embodiment, the inner space of the light shielding layer BY may be defined by the second bottom surface BY_BS2, a sidewall BY_SW connecting the first bottom surface BY_BS1 and the second bottom surface BY_BS2, and the second insulation layer IS-IL2. According to the above description, the light shielding layer BY may have an area greater than that of the second insulation layer IS-IL2 when viewed in a plan view.

Also, the light shielding layer BY may include openings overlapping the pixel area PXA. For example, the pixel areas may be defined in the openings contained in the light shielding layer BY.

The color filter layer CFY may be disposed on the light shielding layer BY and the first insulation layer IS-IL1. In an example embodiment, the color filter layer CFY may include first to third color filters CF1, CF2, and CF3. The first color filter CF1 may serve to transmit light having a first color, the second color filter CF2 may serve to transmit light having a second color, and the third color filter CF3 may serve to transmit light having a third color. For example, the first color is red, the second color is green, and the third color is blue.

According to an embodiment of the inventive concept, each of the first to third color filters CF1, CF2, and CF3 may include a first portion directly disposed on the first insulation layer IS-IL1 and a second portion disposed on the light shielding layer BY. A first boundary between the first color filter CF1 and the second color filter CF2 may be formed on the light shielding layer BY. A second boundary between the third color filter CF3 and the second color filter CF2 may be formed on the light shielding layer BY.

The planarization layer OCY may be disposed on the color filter layer CFY, and the planarization layer OCY may be provided as an organic layer.

The window WM may be disposed on the planarization layer OCY while corresponding to the display surface DD-IS of the display device DD in FIG. 1.

Referring to FIG. 9A, as the thickness of the first insulation layer IS-IL1 according to an embodiment of the inventive concept increases, a distance between each of the second connecting patterns CP2 and a corresponding one of the second sensing patterns SP2 in the third direction DR3 may increase. As a result, a magnitude of a parasitic capacitance generated between the second connecting patterns CP2 and the second sensing patterns SP2 may be reduced.

Also, as the thickness of the first insulation layer IS-IL1 according to an embodiment of the inventive concept increases, a distance between the second sensing patterns SP2 and the second electrode CE of the display panel DP in the third direction DR3 or a distance between the second sensing patterns SP2 and the first electrode AE of the display panel DP in the third direction DR3 may increase. As a result, a magnitude of a parasitic capacitance generated between the second sensing patterns SP2 and the second electrode CE or between the second sensing patterns SP2 and the first electrode AE may be reduced.

Also, referring to FIG. 9B, as a distance between the first sensing patterns SP1 and the second electrode CE of the display panel DP in the third direction DR3 or a distance between the first sensing patterns SP1 and the first electrode AE of the display panel DP in the third direction DR3 increases, a magnitude of a parasitic capacitance generated between the first sensing patterns SP1 and the second electrode CE or between the first sensing patterns SP1 and the first electrode AE may be reduced.

Referring to FIG. 10, a color filter layer CFY according to another embodiment of the inventive concept may be disposed between the input sensing unit ISU and the display panel DP. For example, the color filter layer CFY may be directly disposed on the insulation layer ECL. According to an embodiment of the inventive concept, each of the first to third color filters CF1, CF2, and CF3 may include a first portion directly disposed on the insulation layer ECL and a second portion disposed on the auxiliary light shielding layer BMz. A first boundary between the first color filter CF1 and the second color filter CF2 may be formed on the auxiliary light shielding layer BMz. A second boundary between the third color filter CF3 and the second color filter CF2 may be formed on the auxiliary light shielding layer BMz.

The first conductive patterns contained in the first conductive layer IS-CL1 may be directly disposed on the color filter layer CFY. However, the embodiment of the inventive concept is not limited thereto. For example, an organic layer may be disposed between the first conductive layer IS-CL1 and the color filter layer CFY, and the first conductive layer IS-CL1 may be disposed on the organic layer.

According to the embodiment of the inventive concept, the display device having the reduced magnitude of the parasitic capacitance between the conductive layer of the input sensing unit and the display element layer of the display panel may be provided. Also, the input sensing unit having the reduced magnitude of the parasitic capacitance between two sensing patterns disposed on different layers from each other may be provided. As a result, the display device having the improved overall driving reliability may be provided.

While the present invention have been shown and described with reference to exemplary embodiments thereof, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
a base substrate provided with a plurality of light emitting elements and on which a display area comprising a plurality of pixel areas and a light shielding area disposed adjacent to the pixel areas and a non-display area disposed adjacent to the display area are defined;
a display element layer disposed on the base substrate and comprising a pixel defining layer having a plurality of light emitting openings which overlaps the pixel areas and a plurality of light emitting elements, which overlap the light emitting openings, respectively;
an encapsulation layer covering the plurality of light emitting elements;
a first conductive layer disposed on the encapsulation layer and comprising a plurality of first conductive patterns;
a first insulation layer disposed on the encapsulation layer to cover the plurality of first conductive patterns;
a second conductive layer disposed on the first insulation layer and comprising a plurality of first sensing patterns, a plurality of second conductive patterns electrically connecting the plurality of first sensing patterns, and a plurality of second sensing patterns electrically connected by the plurality of first conductive patterns;
a second insulation layer disposed on the first insulation layer and the second conductive layer without overlapping the plurality of light emitting elements to cover the plurality of first sensing patterns, the plurality of second sensing patterns, and the plurality of second conductive patterns; and
a light shielding layer disposed on the second insulation layer to cover an upper surface and a sidewall of the second insulation layer.

2. The display device of claim 1,
wherein the light shielding layer includes an inner space defined by a first bottom surface that is in contact with the first insulation layer, a second bottom surface that is spaced apart from the first insulation layer and a sidewall connecting the first bottom surface and the second bottom surface.

3. The display device of claim 2,
wherein the second insulation layer is disposed in the inner space of the light shielding layer.

4. The display device of claim 1,
wherein in a thickness direction of the base substrate, the first insulation layer has a thickness greater than that of the second insulation layer.

5. The display device of claim 1,
wherein the first insulation layer, when viewed in a plan view, has an area greater than that of the second insulation layer.

6. The display device of claim 5,
wherein the light shielding layer, when viewed in a plan view, has an area greater than that of the second insulation layer.

7. The display device of claim 1,
wherein the first conductive layer is directly disposed on the encapsulation layer.

8. The display device of claim 1,
wherein the pixel defining layer has a black color.

9. The display device of claim 1,
wherein the second conductive layer further comprises a plurality of sensing signal lines connected to the plurality of first sensing patterns and the plurality of second sensing patterns.

10. The display device of claim 9,
wherein the second insulation layer is disposed on the first insulation layer to cover the plurality of sensing signal lines.

11. The display device of claim 1,
wherein the first insulation layer comprises a plurality of contact holes through which the plurality of second sensing patterns and the plurality of first conductive patterns are electrically connected to each other.

12. The display device of claim 1, further comprising:
a color filter layer comprising a first color filter, a second color filter and a third color filter that transmit lights of different colors from each other,
wherein each of the first to third color filters comprises a first portion, which is directly disposed on the first insulation layer, and a second portion, which is disposed on the light shielding layer.

13. The display device of claim 1, further comprising:
a color filter layer comprising a plurality of color filters disposed between the encapsulation layer and the first conductive layer and transmitting lights of different colors from each other.

14. The display device of claim 13,
wherein the first conductive layer is in contact with the color filter layer.

15. A display device comprising:
a base substrate comprising a display area and a non-display area disposed adjacent to the display area;
a display element layer which is disposed on the base substrate and on which a plurality of pixel areas overlapping the display area are defined, wherein the display element layer includes a plurality of display elements overlapping the pixel areas respectively;
an encapsulation layer disposed on the display element layer;
a plurality of first conductive patterns disposed on the encapsulation layer;
a first insulation layer covering the plurality of first conductive patterns;
a plurality of second conductive patterns disposed on the first insulation layer;
a second insulation layer covering the second conductive patterns; and
a light shielding layer covering an upper surface and a sidewall of the second insulation layer,
wherein each of the second insulation layer and the light shielding layer is in contact with the first insulation layer,
wherein the light shielding layer comprises a plurality of openings each of which overlaps a corresponding one of the plurality of display elements, and
wherein the second insulation layer covers the second conductive patterns without overlapping the plurality of openings.

16. The display device of claim 15,
wherein each of the first insulation layer and the light shielding layer, when viewed in a plan view, has an area greater than that of the second insulation layer.

* * * * *